US011056597B2

(12) United States Patent
Nakamura et al.

(10) Patent No.: US 11,056,597 B2
(45) Date of Patent: Jul. 6, 2021

(54) PHOTOELECTRIC CONVERSION DEVICE, PHOTOSENSOR, POWER GENERATION DEVICE, AND PHOTOELECTRIC CONVERSION METHOD

(71) Applicant: RIKEN, Wako (JP)

(72) Inventors: Masao Nakamura, Wako (JP); Masashi Kawasaki, Wako (JP); Yoshinori Tokura, Wako (JP); Naoto Nagaosa, Wako (JP); Takahiro Morimoto, Wako (JP); Yoshio Kaneko, Wako (JP)

(73) Assignee: RIKEN, Saitama (JP)

( * ) Notice: Subject to any disclaimer, the term of this patent is extended or adjusted under 35 U.S.C. 154(b) by 166 days.

(21) Appl. No.: 16/233,445

(22) Filed: Dec. 27, 2018

(65) Prior Publication Data

US 2019/0214513 A1    Jul. 11, 2019

(30) Foreign Application Priority Data

Jan. 5, 2018 (JP) .............................. JP2018-000543

(51) Int. Cl.
*H01L 31/0224* (2006.01)
*H01L 31/12* (2006.01)
(Continued)

(52) U.S. Cl.
CPC .... *H01L 31/022433* (2013.01); *H01L 31/032* (2013.01); *H01L 31/061* (2013.01);
(Continued)

(58) Field of Classification Search
CPC ....... H01L 31/0256–03365; H01L 2031/0344; H01L 51/42–448; H01L 31/05–0516; H01L 31/022433
See application file for complete search history.

(56) References Cited

U.S. PATENT DOCUMENTS 7,397,301 B1 * 7/2008 Brocato ................... H03D 1/22
250/338.3
8,963,142 B2 * 2/2015 Nihei .................. C09B 29/0085
257/40
(Continued)

FOREIGN PATENT DOCUMENTS

JP        2015130464 A     7/2015

OTHER PUBLICATIONS

Nakamura, M. et al. Impact of electrodes on the extraction of shift current from a ferroelectric semiconductor SbSI. Appl. Phys. Lett. 113, 232901 (2018).

*Primary Examiner* — Bac H Au
(74) *Attorney, Agent, or Firm* — Volpe Koenig

(57) ABSTRACT

A photoelectric conversion device includes a photoelectric conversion element formed of a polar material and including no p-n junction, and first and second electrodes provided on the photoelectric conversion element and arranged at an interval. Space-inversion symmetry of a structure of the photoelectric conversion element is broken. The first and second electrodes are each formed of a metal material that generates no substantial potential barrier preventing majority carriers for the photoelectric conversion element from moving from the electrode to the photoelectric conversion element. Light incidence on the photoelectric conversion element without voltage application between the first and second electrodes causes electromotive force to be generated between first and second electrodes, and enables electric current to be continuously taken out from the first and second electrodes.

14 Claims, 16 Drawing Sheets

(51) Int. Cl.
  *H01L 31/061*    (2012.01)
  *H01L 51/42*     (2006.01)
  *H01L 31/09*     (2006.01)
  *H01L 31/032*    (2006.01)
  *H01L 51/00*     (2006.01)

(52) U.S. Cl.
  CPC .............. *H01L 31/09* (2013.01); *H01L 31/12* (2013.01); *H01L 51/4206* (2013.01); *H01L 51/0051* (2013.01); *H01L 51/0068* (2013.01)

(56) References Cited

U.S. PATENT DOCUMENTS

| | | | |
|---|---|---|---|
| 2010/0032548 A1* | 2/2010 | Murata | H01L 27/305 |
| | | | 250/206 |
| 2010/0081231 A1* | 4/2010 | Hirata | H01L 31/0352 |
| | | | 438/102 |
| 2013/0026382 A1* | 1/2013 | Yao | H01L 31/108 |
| | | | 250/372 |
| 2014/0290733 A1* | 10/2014 | Hamada | H01L 31/032 |
| | | | 136/256 |
| 2015/0155418 A1 | 6/2015 | Hamada | |
| 2017/0278784 A1* | 9/2017 | Moriwaki | H01L 27/307 |
| 2017/0330983 A1* | 11/2017 | Davies | C04B 35/462 |
| 2018/0122583 A1* | 5/2018 | Choi | H01L 31/022408 |
| 2018/0247770 A1* | 8/2018 | Yen | H01L 51/0071 |
| 2018/0337357 A1* | 11/2018 | Matsushima | C30B 7/00 |
| 2019/0170849 A1* | 6/2019 | Hermes | G01S 17/48 |

* cited by examiner

PHOTOELECTRIC CONVERSION DEVICE, PHOTOSENSOR, POWER GENERATION DEVICE, AND PHOTOELECTRIC CONVERSION METHOD

CROSS REFERENCE TO RELATED APPLICATION

This application claims priority based on Japanese patent application No. 2018-000543 filed on Jan. 5, 2018, of which disclosure is incorporated herein in its entirety.

BACKGROUND OF THE INVENTION

Field of the Invention

The present invention relates to a technique of causing movement of majority carriers (electrons or positive holes) in a photoelectric conversion element by light incidence on the photoelectric conversion element so that current due to the movement is taken out from electrodes provided in the photoelectric conversion element.

Background Art

Conventionally, a general photoelectric conversion includes an n-type semiconductor and a p-type semiconductor. A p-n junction between the n-type semiconductor and the p-type semiconductor causes an internal electric field to be generated in the photoelectric conversion element. The light incidence on the photoelectric conversion element causes electrons to jump from a valance band to a conduction band so that pairs of electrons and positive holes are generated. By the internal electric field, these electrons and positive holes are moved to the n-type side and p-type side respectively, and are separated from each other. Thus, current can be taken out from the photoelectric conversion element. Such a photoelectric conversion device is described in Patent Literature 1, for example.

CITATION LIST

Patent Literature

[Patent Literature 1] Japanese Patent Application Laid-Open No. 2015-130464

SUMMARY OF THE INVENTION

Technical Problem

However, carriers (electrons or positive holes) generated by the light incidence on the photoelectric conversion element including the p-n junction are scattered due to impurities, defects, lattice vibration, and the like in the photoelectric conversion element. Since movement of the carriers is accompanied by such scattering, energy of the carriers is scattered and lost. Therefore, there is a limitation on efficiency of taking out current from the photoelectric conversion element including the p-n junction.

In view of the above, an object of the present invention is to provide a technique capable of reducing the scattering of carriers generated by light incidence on a photoelectric conversion element, and efficiently taking out, from the photoelectric conversion element, current caused by movement of the carriers.

Solution to Problem

A photoelectric conversion device according to the present invention includes a photoelectric conversion element formed of a polar material and including no p-n junction, and first and second electrodes provided on the photoelectric conversion element and arranged at an interval. Space-inversion symmetry of a structure of the photoelectric conversion element is broken. The first and second electrodes are each formed of a metal material that generates no substantial potential barrier. The potential barrier prevents majority carriers for the photoelectric conversion element from moving from the electrode to the photoelectric conversion element.

A photosensor according to the present invention includes the above-described photoelectric conversion device, and detects light incidence on the photoelectric conversion element, on a basis of current taken out from the first and second electrodes.

A power generation device according to the present invention includes the above-described photoelectric conversion device, and supplies, to a storage battery or a load, power taken out from the first and second electrode.

A photoelectric conversion method according to the present invention uses the above-described photoelectric conversion device, makes light incident on the photoelectric conversion element between the first and second electrodes, and takes out, from the first and second electrodes, current generated in the photoelectric conversion element.

Additional advantages are explained by the inventors in "Impact of electrodes on the extraction of shift current from a ferroelectric semiconductor SbSI," *Appl. Phys. Lett.* 113, 232901 (2018) (doi: 10.1063/1.5055692), published by the American Institute of Physics which is incorporated by reference as if fully set forth.

Advantageous Effect of Invention

According to the present invention, carriers generated by light incidence on the photoelectric conversion element is less scattered, and current due to movement of the carriers can be efficiently taken out from the photoelectric conversion element.

BRIEF DESCRIPTION OF THE DRAWINGS

FIG. 9A illustrates relation between a temperature and a current when a bias voltage is zero;

DESCRIPTION OF THE EMBODIMENT

Figure 1:
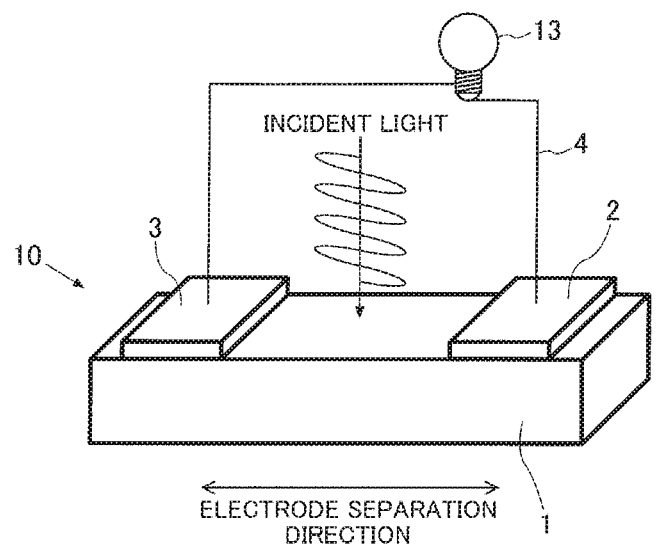
FIG. 1 is a configuration diagram of a photoelectric conversion device according to an embodiment of the present invention.

An embodiment of the present invention is described based on the accompanying drawings. Note that elements common in the respective drawings are denoted by the same reference numerals, and the overlapping description thereof is omitted. The following description does not limit the invention described in claims. For example, the present invention is not limited to a configuration including all of constituent elements described below.

<Summary of Photoelectric Conversion Device>

FIG. 1 is a configuration diagram of a photoelectric conversion device 10 according to an embodiment of the present invention. The photoelectric conversion device 10 includes a photoelectric conversion element 1 and first and second electrodes 2 and 3.

The photoelectric conversion element 1 is formed of a polar material. The polar material is a material having a structure in which gravity center positions of positive and negative charges are different from each other. The polar material may be a polarized material. For example, the polar material is a pyroelectric material or a ferroelectric material. Note that the photoelectric conversion element 1 may be formed of a single polar material. Here, the "single polar material" means a material in which atoms, molecules, or ions are arranged regularly, and may be a material including no material components that do not correspond to such arrangement. For example, the term "single" may mean that when the polar material is any one of specific examples described below, the photoelectric conversion element 1 does not include a material other than the specific example.

The structure of the photoelectric conversion element 1 has broken space-inversion symmetry. This means that when mirror image inversion of the structure (e.g., the crystal structure or the molecular structure) of the photoelectric conversion element 1 is performed, the structure before the mirror image inversion does not coincide with the structure after the mirror image inversion. The photoelectric conversion element 1 has a structure whose space-inversion symmetry is broken in at least one direction (the horizontal direction of FIG. 1). In this case, even when any position in the direction is set as a reference point for mirror image inversion (a position of a mirror for mirror image inversion), the structure before the mirror image inversion does not coincide with the structure after the mirror image inversion. Note that the photoelectric conversion element 1 is formed of the polar material, and for this reason, has the structure of the broken space-inversion symmetry as described above.

Further, the photoelectric conversion element 1 includes no p-n junction. The photoelectric conversion element 1 (polar material) is a p-type semiconductor or an n-type semiconductor. Note that the polar material may be, but does not need to be an intrinsic semiconductor.

The first and second electrodes 2 and 3 are provided for taking out, to the outside, current (hereinafter also called simply "current generated in the photoelectric conversion element 1") due to the movement of majority carriers generated in the photoelectric conversion element 1 by light incidence on the photoelectric conversion element 1. A current line 4 (e.g. a conducting wire) is connected to the first and second electrodes 2 and 3. The current generated in the photoelectric conversion element 1 flows to the current line 4 through the first and second electrodes 2 and 3. The first and second electrodes 2 and 3 may be connected to each other through the current line 4. In the example of FIG. 1, the current line 4 is provided with a resistor (electric bulb) 13.

The first and second electrodes 2 and 3 are provided in the photoelectric conversion element 1, and are arranged at an interval from each other. The direction in which the first and second electrodes 2 and 3 are separated from each other is hereinafter called an electrode separation direction. The first and second electrodes 2 and 3 may contact directly with the photoelectric conversion element 1. Space-inversion symmetry of the structure of the photoelectric conversion element 1 is broken in the electrode separation direction. Further, the photoelectric conversion element 1 may be polarized in the electrode separation direction.

The first and second electrodes 2 and 3 are made of a metal material which causes no substantial potential barrier. The potential barrier prevents majority carriers (hereinafter simply called majority carriers) for the photoelectric conversion element 1 from moving from the electrodes 2 and 3 to the photoelectric conversion element 1. In other words, in a state in which the first and second electrodes 2 and 3 are connected to the photoelectric conversion element 1, the potential barrier to the majority carriers does not exist at an interface between the photoelectric conversion element 1 and each of the electrodes 2 and 3, from a standpoint of the electrodes 2 and 3.

When the photoelectric conversion element 1 is a p-type semiconductor, metal materials that form the first and second electrodes 2 and 3 have Fermi levels equal to or lower than a Fermi level of the polar material which forms the photoelectric conversion element 1. This may be described as that work functions of the metal materials are equal to or larger than a work function of the polar material. Thus, the first and second electrodes 2 and 3 do not generate the above-described potential barrier (details thereof are described below with reference to FIG. 3A to FIG. 4B). Note that the Fermi level of each of the first and second electrodes 2 and 3 may be equal to or lower than the Fermi level of the photoelectric conversion element 1 as the p-type semiconductor, but does not need to have a particular lower limit thereof.

In one example, when the photoelectric conversion element 1 is the p-type semiconductor, the Fermi level of the metal material of each of the first and second electrodes 2 and 3 is lower (deeper) than the Fermi level of the polar material.

When the photoelectric conversion element 1 is an n-type semiconductor, the metal material of each of the first and second electrodes 2 and 3 has a Fermi level equal to or higher than the Fermi level of the polar material of the photoelectric conversion element 1. This may be described as that a work function of the metal material is equal to or smaller than the work function of the polar material. Thus, the first and second electrodes 2 and 3 do not generate the above-described potential barriers (details thereof are described below with reference to FIG. 5A to FIG. 6B). Note that the Fermi level of each of the first and second electrodes 2 and 3 may be equal to or higher than the Fermi level of the photoelectric conversion element 1 as the n-type semiconductor, but does not need to have a particular upper limit thereof.

In one example, when the photoelectric conversion element 1 is the n-type semiconductor, the Fermi level of the metal material each of the first and second electrodes 2 and 3 is higher (shallower) than the Fermi level of the polar material.

Note that regardless of whether the photoelectric conversion element 1 is the p-type semiconductor or the n-type semiconductor, the metal material of the first electrode 2 may be the same as or different from that of the second electrode 3.

Hereinafter, the photoelectric conversion device 10 according to the embodiment of the present invention is described in more detail.
<Breakdown of Space-Inversion Symmetry>

Figure 2:
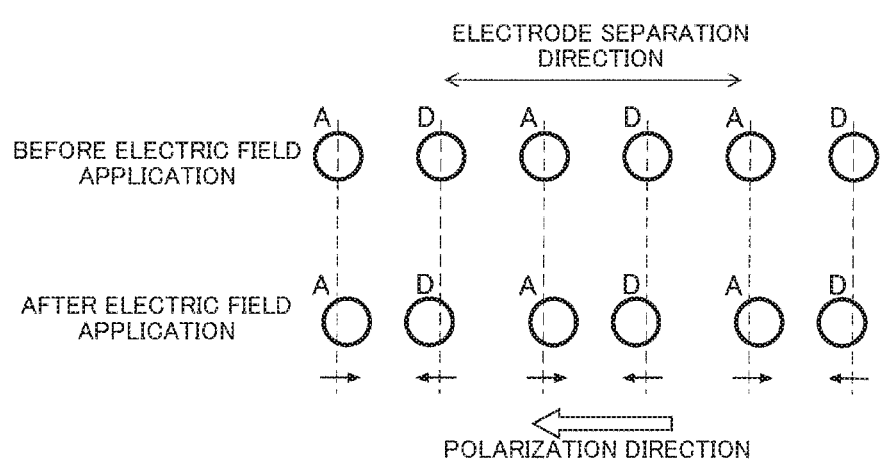
FIG. 2 is a schematic diagram illustrating one example of a molecular structure of a photoelectric conversion element.

A breakdown of the space-inversion symmetry is described in more detail with reference to FIG. 2. FIG. 2 is a schematic diagram illustrating, as one example, a molecular structure of the photoelectric conversion element 1 in the photoelectric conversion device 10 of FIG. 1. In FIG. 2, the polar material that forms the photoelectric conversion element 1 is a ferroelectric material. The ferroelectric material becomes a ferroelectric when a temperature thereof becomes equal to or lower than its own Curie temperature. The horizontal direction of FIG. 2 is the electrode separation direction, and corresponds to the horizontal direction of FIG. 1.

The upper side of FIG. 2 indicates a paraelectric state at a temperature higher than the Curie temperature, and the lower side of FIG. 2 indicates a ferroelectric state at a temperature equal to or lower than the Curie temperature or less. On the upper and lower sides of FIG. 2, donor molecules D and acceptor molecules A are alternately positioned in the electrode separation direction. For example, the polar material that forms the photoelectric conversion element 1 may be TTF-CA. The donor molecule D may be TTF (tetrathiafulvalne), and the acceptor molecule A may be CA (p-chloranil).

When an electric field is applied to the photoelectric conversion element 1 in the electrode separation direction in a state of the upper side of FIG. 2, positively charged donor molecules D are displaced in the direction of the application of the electric field, and the negatively charged acceptor molecules A are displaced in the direction opposite to the application direction of the electric field, as illustrated in the lower side of FIG. 2. Thus, the photoelectric conversion element 1 becomes a state polarized in the right direction of FIG. 2. In other words, the photoelectric conversion element 1 is polarized in the application direction of the electric field, and thereby the space-inversion symmetry of the structure thereof is broken. Even after the stop of the electric field application, the polarization of the photoelectric conversion element 1 is maintained. Thus, the state in which the space-inversion symmetry of the structure of the photoelectric conversion element 1 is broken is maintained even after the stop of the electric field application.

Thus, in the lower side of FIG. 2, the space-inversion symmetry of the molecule structure of the photoelectric conversion element 1 is broken, and for this reason, the molecule structure reflected in a plane mirror orthogonal to the electrode separation direction does not coincide with the original molecular structure corresponding to the reflected molecular structure even when the mirror is arranged at any position in the electrode separation direction.
<Specific Examples of Material>

When the photoelectric conversion element 1 is the p-type semiconductor, the polar material as the p-type semiconductor may be SbSI, $BiFeO_3$, TTF-CA (tetrathiafulvalene-p-chloranil), TTF-BA (tetrathiafulvalene-bromanil), TMB-TCNQ (tetramethylbenzidine-tetracyanoquinodimethane), GeTe, CdTe, $GaFeO_3$, $RMnO_3$ (R: rare-earth element), $Ca_3Mn_2O_7$, $LuFe_2O_4$, $CH_3NH_3PbI_3$, (2-(ammoniomethyl)pyridinium)$SbI_5$, or $Sn_2P_2S_6$, for example. In this case, the metal material that forms each of the first and second electrodes 2 and 3 may be one, having a Fermi level equal to or lower than the Fermi level of the photoelectric conversion element 1, of Ag, Pt, Au, ITO, $MoO_3$, TTF-TCNQ (tetrathiafulvalene-tetracyanoquinodimethane), and PEDOT:PSS(poly(3,4-ethylenedioxythiophene)-poly(styrenesulfonate)), for example.

When the photoelectric conversion element 1 is the n-type semiconductor, the polar material as the n-type semiconductor may be BiSI, $BaTiO_3$, $PbTiO_3$, $Pb_5Ge_3O_{11}$, $Pb(Zr,Ti)O_3$ (PZT), CdS, $LiNbO_3$, $LiTaO_3$, $KNbO_3$, $KH_2PO_4$(KDP), ZnO, BiTeI, BiTeBr, or GaN, for example. In this case, the metal material that forms each of the first and second electrodes 2 and 3 may be one, having a Fermi level equal to or higher than the Fermi level of the photoelectric conversion element 1, of Ca, Mg, LiF/Al, In, and Al, for example.

The polar material that forms the photoelectric conversion element 1 may be a pyroelectric material. The pyroelectric material may be $GaFeO_3$, CdS, GaN, ZnO, CdTe, BiTeI, or BiTeBr, for example.

The polar material that forms the photoelectric conversion element 1 may be a ferroelectric material. The ferroelectric material may be SbSI, BiSI, TTF-CA, TTF-BA, $BiFeO_3$, TMB-TCNQ, $RMnO_3$(R: rare-earth element), $Ca_3Mn_2O_7$, $LuFe_2O_4$, GeTe, $CH_3NH_3PbI_3$, (2-(ammoniomethyl)pyridinium)$SbI_5$, $Sn_2P_2S_6$, $BaTiO_3$, $PbTiO_3$, $Pb_5Ge_3O_{11}$, PZT, $LiNbO_3$, $LiTaO_3$, $KNbO_3$, or KDP, for example.

Instead, the polar material that forms the photoelectric conversion element 1 may be one formed by stacking thin layered films on each other N times (where N is an integer of one or more). This thin layered film is one formed by stacking an A layer, a B layer, and a C layer in this order, with crystal materials of the A layer, the B layer, and the C layer being different from each other. Each of the A layer, the B layer, and the C layer is an atomic layer thin film having a nano-order thickness. Here, the atomic layer thin film may be a single crystal. A combination of the crystal materials for the A layer, the B layer, and the C layer may be a combination of $LaAlO_3$, $LaFeO_3$, and $LaCrO_3$, or a combination of $CaTiO_3$, $BaTiO_3$, and $SrTiO_3$, for example. In other words, in one example of the former combination, the A layer is formed of $LaAlO_3$, the B layer is formed of $LaFeO_3$, and the C layer is formed of $LaCrO_3$.

Note that the polar material and the materials of the electrodes 2 and 3 are not limited to the above-described specific examples. For example, the polar material may be a piezoelectric material.

<Potential Barrier>
Case of p-Type Semiconductor

Figure 3A:
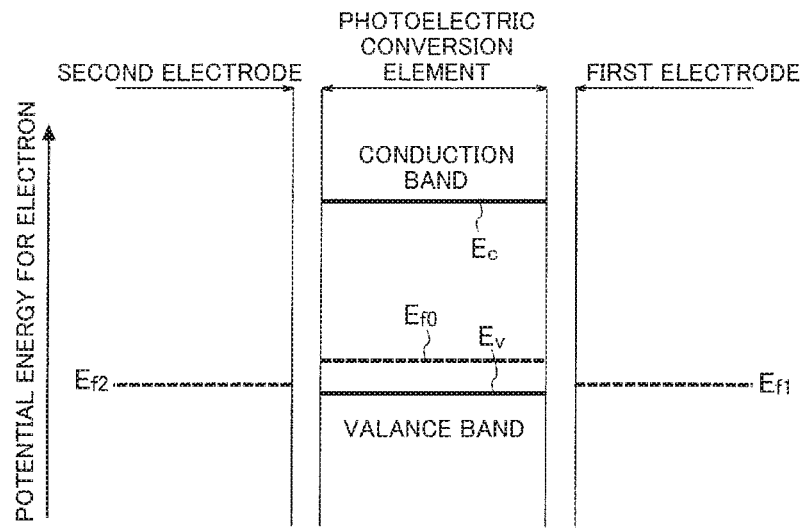
FIG. 3A is a band structure diagram when the photoelectric conversion element according to the embodiment of the present invention is a p-type semiconductor.
Figure 3B:
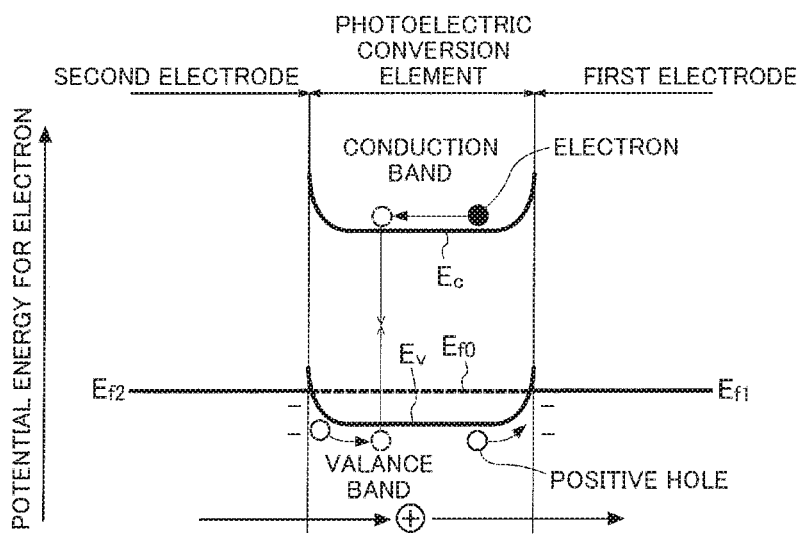
FIG. 3B is a band structure diagram when first and second electrodes are connected to the photoelectric conversion element from a state of FIG. 3A.

FIG. 3A and FIG. 3B are schematic diagrams of band structures of the photoelectric conversion element 1 and the electrodes 2 and 3 according to the embodiment of the present invention, and illustrate the case where the photoelectric conversion element 1 is the p-type semiconductor. FIG. 3A illustrates a state where the first and second electrodes 2 and 3 are separated from the photoelectric conversion element 1, and FIG. 3B illustrates a state where the first and second electrodes 2 and 3 are connected to the photoelectric conversion element 1 as illustrated in FIG. 1. In FIG. 3A and FIG. 3B, $E_c$ indicates an energy level of a lower end of a conduction band, and $E_v$ indicates an energy level of an upper end of a valance band (the same applies to the case of FIG. 4A to FIG. 6B described below).

In the present embodiment, when the photoelectric conversion element 1 is the p-type semiconductor, the first and second electrodes 2 and 3 (i.e., the metal materials forming the electrodes 2 and 3) both have Fermi levels $E_{f1}$ and $E_{f2}$ equal to or lower than a Fermi level $E_{f0}$ of the photoelectric conversion element 1 (i.e., the polar material forming the photoelectric conversion element 1) as illustrated in FIG. 3A. When the first and second electrodes 2 and 3 are connected to the photoelectric conversion element 1 from the state of FIG. 3A, positive holes as majority carriers for the photoelectric conversion element 1 flow from the respective electrodes 2 and 3 into the photoelectric conversion element 1 where a Fermi level is higher, whereby in each of the electrodes 2 and 3, the interface with the photoelectric conversion element 1 is negatively charged. As a result, as illustrated in FIG. 3B, the bands of the photoelectric conversion element 1 are bent on the sides of the electrodes 2 and 3 such that the Fermi levels $E_{f1}$ and $E_{f2}$ of the first and second electrodes 2 and 3 respectively coincide with the Fermi level $E_{f0}$ of the photoelectric conversion element 1.

Since the electrodes 2 and 3 and the photoelectric conversion element 1 make ohmic contact therebetween in the state of FIG. 3B, the electrodes 2 and 3 do not generate a substantial potential barrier that prevents majority carriers from moving from the electrodes 2 and 3 to the photoelectric conversion element 1. In other words, such a potential barrier does not occur in the interface between each of the electrodes 2 and 3 and the photoelectric conversion element 1. Thus, the majority carriers (positive holes) for the photoelectric conversion element 1 can easily move from the electrodes 2 and 3 to the photoelectric conversion element 1.

Here, the first and second electrodes 2 and 3 are connected to each other through the current line 4 at the outside of the photoelectric conversion device 10 as illustrated in FIG. 1. Thus, when each pair of an electron and a positive hole occurs in the photoelectric conversion element 1 by light incidence on the photoelectric conversion element 1, the positive holes as the majority carriers are moved to one electrode 2 or 3 in the valance band by a breakdown of the space-inversion symmetry in the photoelectric conversion element 1. In FIG. 3B, the positive holes are moved to the first electrode 2 by polarization of the photoelectric conversion element 1.

Meanwhile, since the above-described potential barrier does not occur in the interface between each of the electrodes 2 and 3 and the photoelectric conversion element 1, the majority carriers are supplied from the other electrode 2 or 3 (second electrode 3 in FIG. 3B) to the photoelectric conversion element 1 one after another. The supplied positive holes recombine with electrons generated and excited to the conduction band by light incidence, one after another. Thus, the positive holes are generated by the incidence of light on the photoelectric conversion element 1, current due to the movement of the positive holes is continuously generated in the photoelectric conversion element 1, and the current can be taken out from the first and second electrodes 2 and 3 to the external current line 4.

Figure 4A:
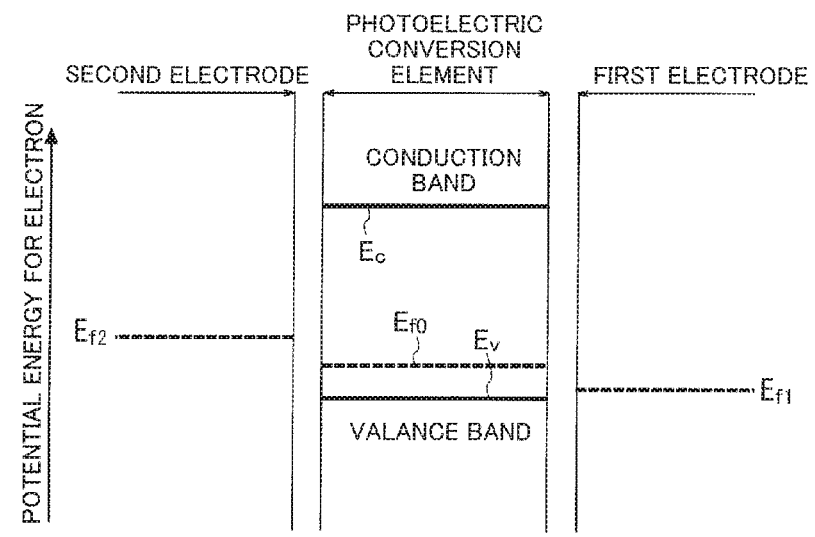
FIG. 4A is a band structure diagram when a photoelectric conversion element according to a comparative example is a p-type semiconductor.
Figure 4B:
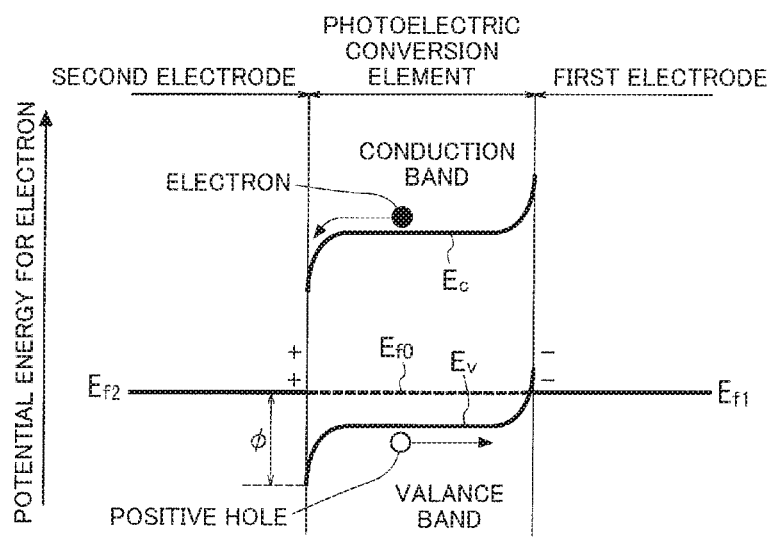
FIG. 4B is a band structure diagram when first and second electrodes are connected to the photoelectric conversion element from a state of FIG. 4A.

FIG. 4A and FIG. 4B are schematic diagrams of band structures for a photoelectric conversion element and electrodes according to a comparative example, and illustrate the case where the photoelectric conversion element is a p-type semiconductor. FIG. 4A illustrates a state where first and second electrodes are separated from the photoelectric conversion element, and FIG. 4B illustrates a state where the first and second electrodes are connected to the photoelectric conversion element.

In FIG. 4A, the first electrode has a Fermi level $E_{f1}$ equal to or lower than a Fermi level $E_{f0}$ of the photoelectric conversion element formed of a polar material, whereas the second electrode has a Fermi level $E_{f2}$ higher than the Fermi level $E_{f0}$ of the photoelectric conversion element. In FIG. 4A, the other points are assumed to be the same as in the case of FIG. 3A. When the first and second electrodes are connected to the photoelectric conversion element from the state of FIG. 4A, positive holes as majority carriers for the photoelectric conversion element flow from the first electrode into the photoelectric conversion element where a Fermi level is higher, whereby in the first electrode, the interface with the photoelectric conversion element is negatively charged. Meanwhile, positive holes are moved from the photoelectric conversion element to the second electrode where Fermi level is higher, whereby in the second electrode, the interface with the photoelectric conversion element is positively charged. As a result, as illustrated in FIG. 4B, the bands of the photoelectric conversion element are bent on the sides of the electrode in such that the Fermi levels $E_{f1}$ and $E_{f2}$ of the first and second electrodes respectively coincide with the Fermi level $E_{f0}$ of the photoelectric conversion element.

In the state of FIG. 4B, the second electrode generates a potential barrier that prevents the positive holes as the majority carriers from moving from the second electrode to the photoelectric conversion element. In other words, such a potential barrier occurs in the interface between the second electrode and the photoelectric conversion element. Accordingly, assuming that magnitude of a charge quantity of each positive hole is q, and magnitude of the potential barrier is ϕ, energy of qϕ is required to supply the positive hole from the second electrode to the photoelectric conversion element. Thus, it is difficult to supply the majority carriers (positive holes) from the second electrode to the photoelectric conversion element, and for this reason, even when the positive holes are generated in the valance band by the light incidence on the photoelectric conversion element, movement of the positive holes to the first electrode side is suppressed in the photoelectric conversion element, so that current taken out from the first and second electrodes to the outside is suppressed.

Figure 5A:
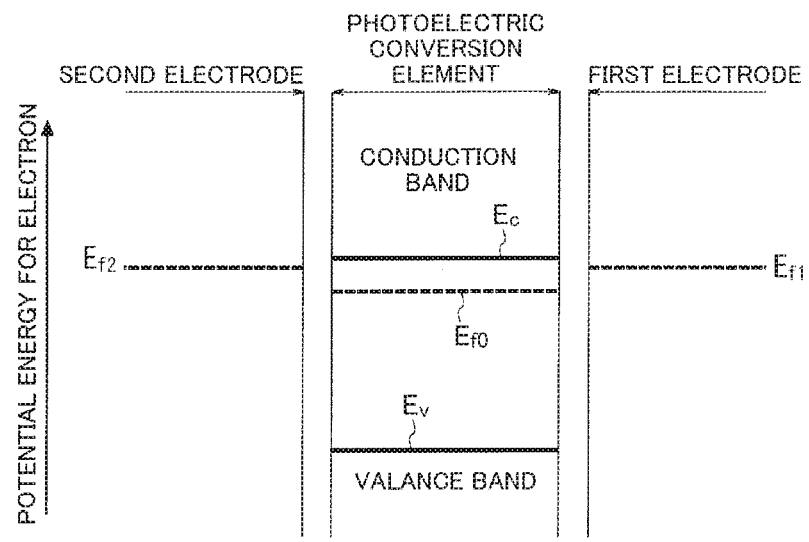
FIG. 5A is a band structure diagram when the photoelectric conversion element according to the embodiment of the present invention is an n-type semiconductor.
Figure 5B:
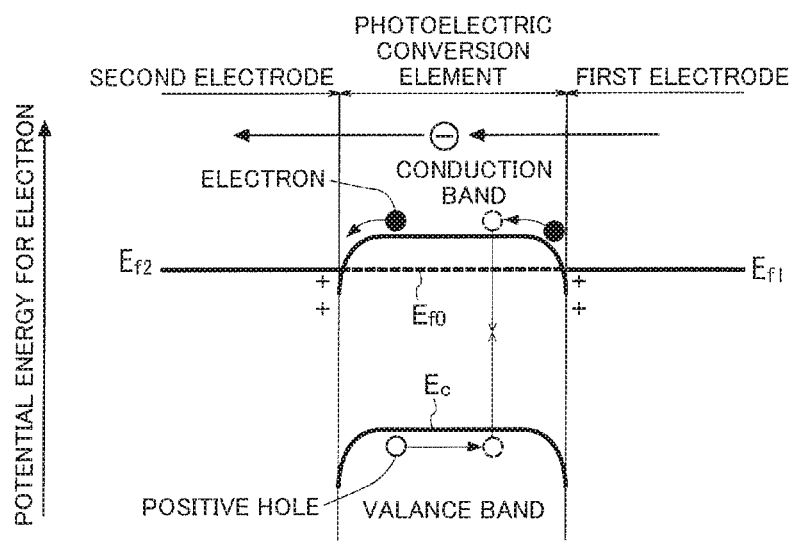
FIG. 5B is a band structure diagram when first and second electrodes are connected to the photoelectric conversion element from a state of FIG. 5A.

Case of n-Type Semiconductor:

FIG. 5A and FIG. 5B are schematic diagrams of band structures of the photoelectric conversion element 1 and the electrodes 2 and 3 according to the embodiment of the present invention, and illustrate the case where the photoelectric conversion element 1 is an n-type semiconductor. FIG. 5A illustrates a state where the first and second electrodes 2 and 3 are separated from the photoelectric conversion element 1, and FIG. 5B illustrates a state where the first and second electrodes 2 and 3 are connected to the photoelectric conversion element 1 as illustrated in FIG. 1.

In the present embodiment, when the photoelectric conversion element 1 is the n-type semiconductor, the first and second electrodes 2 and 3 both have Fermi levels $E_{f1}$ and $E_{f2}$ equal to or higher than a Fermi level $E_{f0}$ of the photoelectric conversion element 1 as illustrated in FIG. 5A. When the first and second electrodes 2 and 3 are connected to the photoelectric conversion element 1 from the state of FIG. 5A, electrons as majority carriers for the photoelectric conversion element 1 flow from the respective electrodes 2 and 3 into the photoelectric conversion element 1 where a Fermi level is lower, whereby in the respective electrodes 2 and 3, the interface with the photoelectric conversion element 1 is positively charged. As a result, as illustrated in FIG. 5B, the bands of the photoelectric conversion element 1 are bent on the sides of the electrodes 2 and 3 such that the Fermi levels $E_{f1}$ and $E_{f2}$ of the first and second electrodes 2 and 3 respectively coincide with the Fermi level $E_{f0}$ of the photoelectric conversion element 1.

Since the electrodes 2 and 3 and the photoelectric conversion element 1 make ohmic contact therebetween in the state of FIG. 5B, the electrodes 2 and 3 do not generate a substantial potential barrier that prevents majority carriers from moving from the electrodes 2 and 3 to the photoelectric conversion element 1. In other words, such a potential barrier does not occur in the interface between each of the electrodes 2 and 3 and the photoelectric conversion element 1. Thus, the majority carriers (electrons) for the photoelectric conversion element 1 can easily move from the electrodes 2 and 3 to the photoelectric conversion element 1. Here, the first and second electrodes 2 and 3 are connected to each other through the current line 4 at the outside of the photoelectric conversion device 10 as illustrated in FIG. 1. Thus, when each pair of an electron and a positive hole occurs in the photoelectric conversion element 1 by light incidence on the photoelectric conversion element 1, the electrons as the majority carriers are moved to one electrode 2 or 3 in a conduction band by a breakdown of the space-inversion symmetry in the photoelectric conversion element 1. In FIG. 5B, the electrons are moved to the second electrode 3 by polarization of the photoelectric conversion element 1.

Meanwhile, since the above-described potential barrier does not occur in the interface between each of the electrodes 2 and 3 and the photoelectric conversion element 1, the majority carriers (electrons) are supplied from the other electrode 2 or 3 (first electrode 2 in FIG. 5B) to the photoelectric conversion element 1 one after another. The supplied electrons recombine with positive holes generated in the valance band by the light incidence, one after another. Thus, electrons are generated in the conduction band due to the incidence of light on the photoelectric conversion element 1, and current due to the movement of the electrons is continuously generated in the photoelectric conversion element 1. The current can be taken out from the first and second electrodes 2 and 3 to the external current line 4.

Figure 6A:
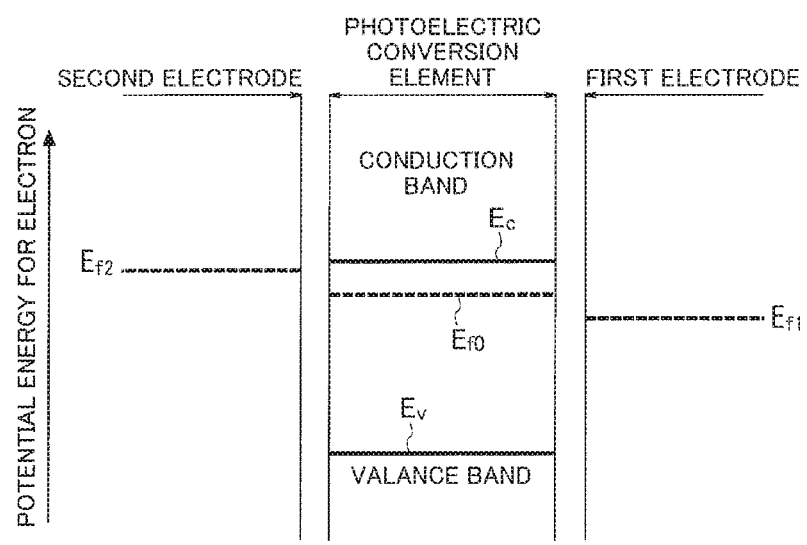
FIG. 6A is a band structure diagram when a photoelectric conversion element according to a comparative example is an n-type semiconductor.
Figure 6B:
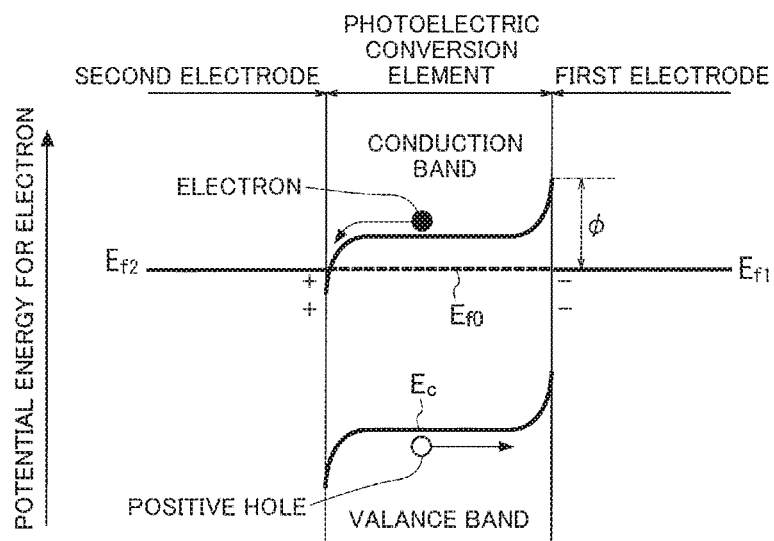
FIG. 6B is a band structure diagram when first and second electrodes are connected to the photoelectric conversion element from a state of FIG. 6A.

FIG. 6A and FIG. 6B are schematic diagrams of band structures of a photoelectric conversion element and electrodes according to a comparative example, and illustrate the case where the photoelectric conversion element is an n-type semiconductor. FIG. 6A illustrates a state where first and second electrodes are separated from the photoelectric conversion element, and FIG. 6B illustrates a state where the first and second electrodes are connected to the photoelectric conversion element.

In FIG. 6A, the second electrode has a Fermi level $E_{f2}$ equal to or higher than a Fermi level $E_{f0}$ of the photoelectric conversion element formed of a polar material, whereas the first electrode has a Fermi level $E_{f1}$ lower than the Fermi level $E_{f0}$ of the photoelectric conversion element. In FIG. 6A, the other points are assumed to be the same as in the case of FIG. 5A. When the first and second electrodes are connected to the photoelectric conversion element from the state of FIG. 6A, electrons as majority carriers for the photoelectric conversion element move from the second electrode to the photoelectric conversion element where Fermi level is lower, whereby in the second electrode, the interface with the photoelectric conversion element is positively charged. Meanwhile, electrons move from the photoelectric conversion element to the first electrode where a Fermi level is lower, whereby in the first electrode, the interface with the photoelectric conversion element is negatively charged. As a result, as illustrated in FIG. 6B, the bands of the photoelectric conversion element are bent on the sides of the electrodes such that the Fermi levels $E_{f1}$ and $E_{f2}$ of the first and second electrodes respectively coincide with the Fermi level $E_{f0}$ of the photoelectric conversion element.

In the state of FIG. 6B, the first electrode generates a potential barrier that prevents electrons as the majority carriers from moving from the first electrode to the photoelectric conversion element. In other words, such a potential barrier occurs in the interface between the first electrode and the photoelectric conversion element. Accordingly, assuming that magnitude of a charge quantity of each electron is q, and magnitude of the potential barrier is ϕ, energy of qϕ is required to supply an electron from the first electrode to the photoelectric conversion element. Thus, it is difficult to supply the majority carriers (electrons) from the first electrode to the photoelectric conversion element, and for this reason, even when electrons are generated in the conduction band by light incidence on the photoelectric conversion element, movement of the electrons to the second electrode side is suppressed in the photoelectric conversion element, and current taken out from the first and second electrodes to the outside is suppressed.

<Equivalent Circuit>

Figure 7A:
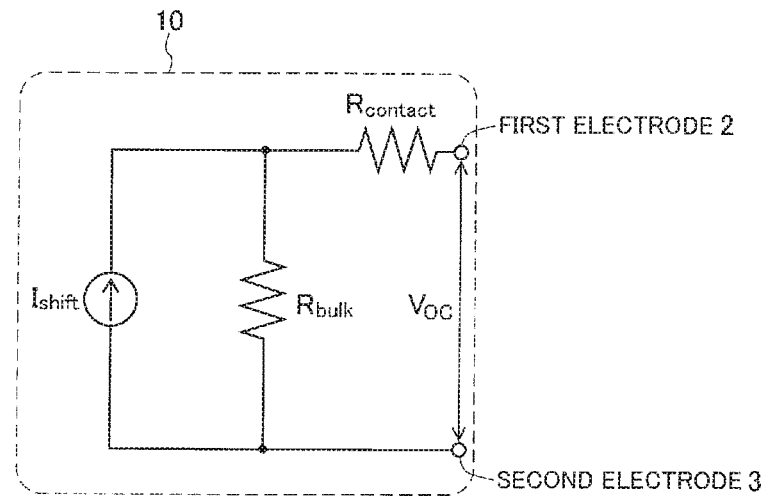
FIG. 7A illustrates an equivalent circuit of the photoelectric conversion device according to the embodiment of the present invention.
Figure 7B:
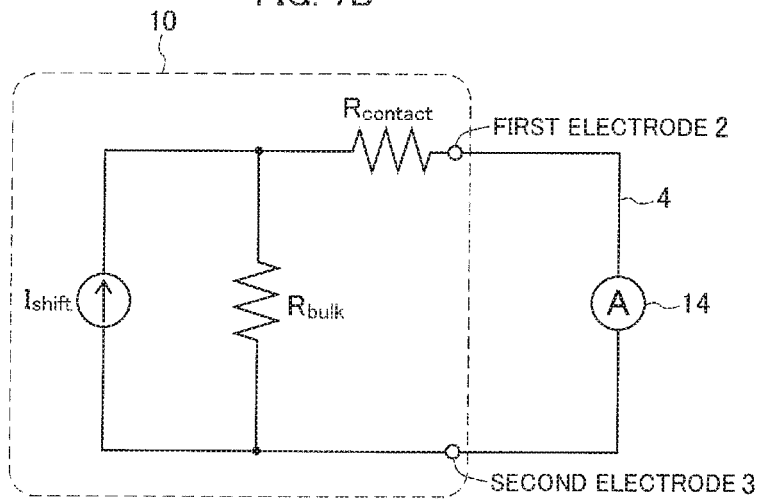
FIG. 7B illustrates an equivalent circuit when first and second electrodes are connected to each other by a current line from a state of FIG. 7A.

FIG. 7A and FIG. 7B each illustrates an equivalent circuit of the photoelectric conversion device 10 according to the embodiment of the present invention. In FIG. 7A, the first and second electrodes 2 and 3 are open therebetween. In FIG. 7B, the first and second electrodes 2 and 3 are connected to each other by the current line 4, and the current line 4 is provided with an ammeter 14.

It is assumed that by light incidence on the photoelectric conversion element 1, a current $I_{shift}$ due to a breakdown of the space-inversion symmetry of the structure thereof is generated in the photoelectric conversion element 1 as in FIG. 1. At this time, when the first and second electrodes 2 and 3 are made open therebetween, $I_{shift}$ is assumed to flow through a resistance $R_{bulk}$ in the photoelectric conversion element 1. At this time, a voltage (open circuit voltage) applied between the first and second electrodes 2 and 3 is assumed to be $V_{oc}$. The voltage $V_{oc}$ is represented by the following equation (1).

$$V_{oc} = R_{bulk} I_{shift} \quad (1)$$

In FIG. 7A, $R_{contact}$ indicates a resistance that is the sum of a contact resistance between the first electrode 2 and the photoelectric conversion element 1 and a contact resistance between the second electrode 3 and the photoelectric conversion element 1. From the state of FIG. 7A, the first and second electrodes 2 and 3 are connected to each other by the current line 4, and is then brought into the state of FIG. 7B. In FIG. 7B, the above-described current $I_{shift}$ is divided into a current flowing through the resistance $R_{bulk}$ and a current $I_{SC}$ flowing into the current line 4 through the contact resistance $R_{contact}$. Here, $I_{SC}$ is represented by the following equation (2):

$$I_{SC} = \frac{R_{bulk}}{R_{bulk} + R_{contact}} I_{shift} \quad (2)$$

Thus, when $R_{bulk}$ is sufficiently larger than $R_{contact}$, $I_{SC}$ can be assumed to be equal to $I_{shift}$. The equation (2) indicates the case where no bias voltage is applied between the first and second electrodes 2 and 3. When a bias voltage $V_b$ is applied between the first and second electrodes 2 and 3 in FIG. 7B, a current value $I_{obs}$ measured by the ammeter 14 is represented by the following equation (3).

$$I_{obs} = \frac{1}{R_{bulk} + R_{contact}} V_b + \frac{R_{bulk}}{R_{bulk} + R_{contact}} I_{shift} \quad (3)$$

From the equations (1), (2), and (3), magnitude of the bias voltage $V_b$ when $I_{obs}$ is zero is equal to the magnitude of the open circuit voltage $V_{oc}$. The symbols $R_{bulk}$, $R_{contact}$, $V_{OC}$, $I_{SC}$, $V_b$, and $I_{obs}$ in the following means $R_{bulk}$, $R_{contact}$, $V_{OC}$, $I_{SC}$, $V_b$, and $I_{obs}$ described above with reference to FIG. 7A and FIG. 7B, respectively.

Experimental Example 1

An experimental example 1 of the photoelectric conversion device 10 according to the embodiment of the present invention is described. In the present experimental example 1, the polar material that forms the photoelectric conversion element 1 is SbSI as a p-type semiconductor, and the material that forms each of the first and second electrodes 2 and 3 is Pt. The Curie temperature of SbSI is about 295 K, and SbSI becomes ferroelectric when a temperature thereof becomes equal to or lower than the Curie temperature.

As in FIG. 1, the first and second electrodes 2 and 3 were connected to each other by the current line 4. The current line 4 was provided with the ammeter 14 (refer to FIG. 7B) instead of the resistor 13 of FIG. 1. A temperature of the photoelectric conversion element 1 was gradually lowered in a state where light was made incident on the photoelectric conversion element 1. Further, at each temperature of the photoelectric conversion element 1, a value of a current flowing through the current line 4 was measured by the ammeter 14 while changing a bias voltage $V_b$ applied between the first and second electrodes 2 and 3. Note that at each temperature, an electric field was applied to the photoelectric conversion element 1 in the electrode separation direction to adjust the polarization direction, the application of the electric field was then stopped, and a current flowing through the current line 4 was measured. After a temperature of the photoelectric conversion element 1 became equal to or lower than the Curie temperature, and current flowed through the current line 4 at the bias voltage $V_b$ of zero, a value of the current was measured at each temperature without application of the electric field. This is because the polarization direction of the photoelectric conversion element 1 was already in an adjusted state. The results of the measurement performed in this manner are illustrated in FIG. 8 to FIG. 10.

Figure 8:
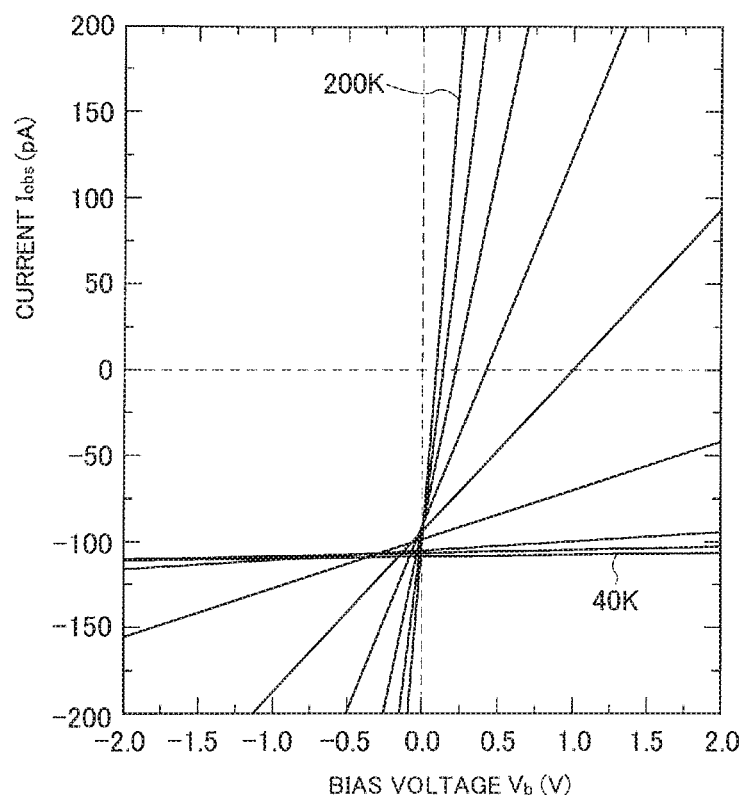
FIG. 8 is a measurement result of an experimental example 1, and illustrates relation between a bias voltage and a current at each temperature.

In FIG. 8, the horizontal axis indicates the bias voltage $V_b$ applied between the first and second electrodes 2 and 3, and the vertical axis indicates the current $I_{obs}$ measured by the ammeter 14. In FIG. 8, the respective straight lines are the measurement result at respective temperatures of the photoelectric conversion element 1. As a temperature at the measurement becomes higher, a gradient of the straight line in FIG. 8 becomes larger. The straight line having the maximum gradient is the measurement result at 200 K, and the straight line having the minimum gradient is the measurement result at 40 K. An inverse number of the gradient of the straight line is equal to "$R_{bulk}+R_{contact}$" ($\approx R_{bulk}$) in the equation (3).

As illustrated in FIG. 8, the large current $I_{obs}$ occurs in the current line 4 when the bias voltage $V_b$ is zero. In other words, light is made incident on the photoelectric conversion element 1 having no p-n junction to thereby make it possible to efficiently take out the current from the photoelectric conversion element 1 through the electrodes 2 and 3.

Hereinafter, the current $I_{obs}$ measured when the bias voltage $V_b$ is zero is referred to also as the current $I_{SC}$.

Figure 9A:
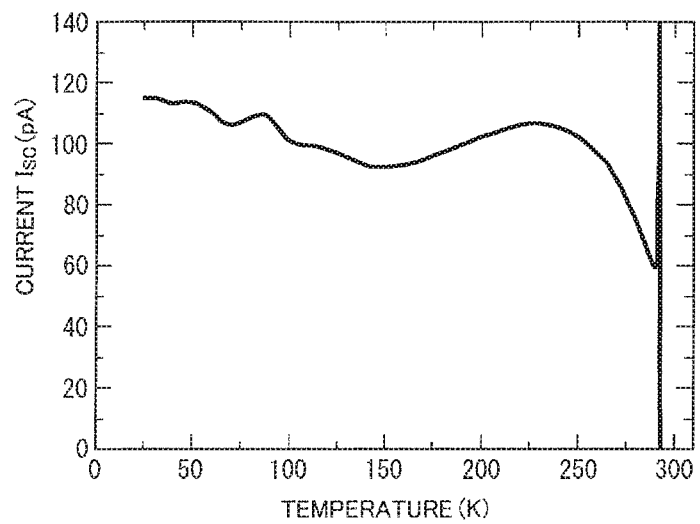
FIGS. 9A and B are measurement results of the experimental example 1.
Figure 10:
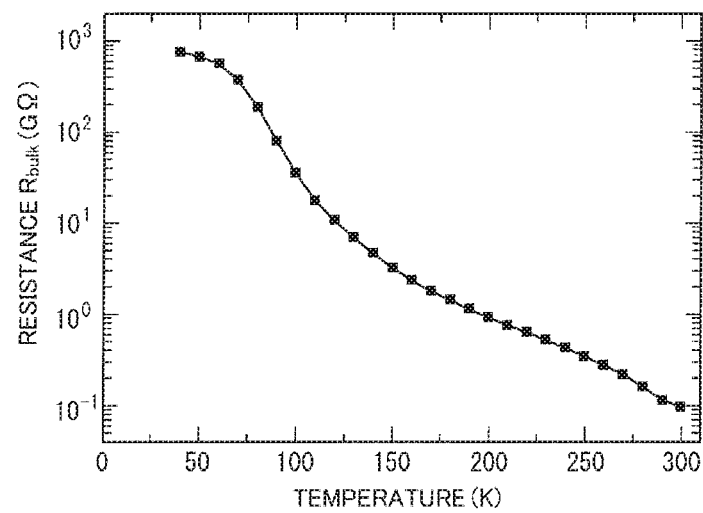
FIG. 10 is a measurement result of the experimental example 1, and illustrates relation between a temperature and a resistance of the photoelectric conversion element.

In FIG. 9A, the horizontal axis indicates a temperature of the photoelectric conversion element 1, and the vertical axis indicates a measured value of the current $I_{SC}$ measured by the ammeter 14 when the bias voltage $V_b$ is zero. As illustrated in FIG. 9A, in the process of lowering a temperature of the photoelectric conversion element 1, when a temperature of the photoelectric conversion element 1 becomes equal to or lower than the Curie temperature, the current $I_{SC}$ occurs abruptly. This indicates that the photoelectric conversion element 1 is transferred into ferroelectric at the Curie temperature, and the space-inversion symmetry of the structure thereof is broken by the above-described application of the electric field.

Figure 9B:
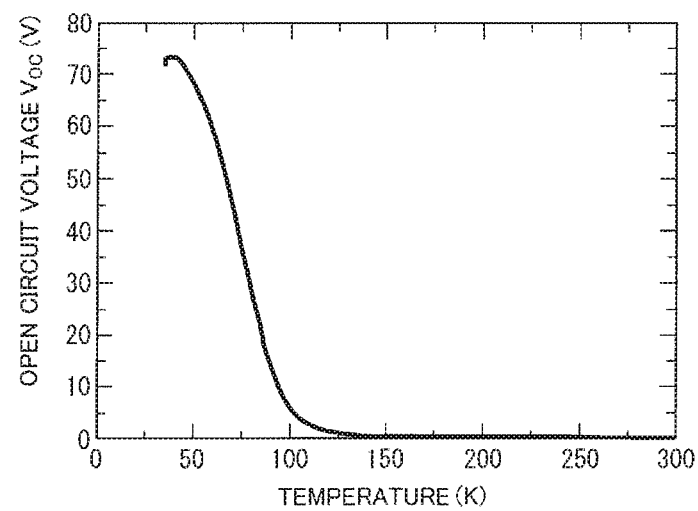
FIG. 9B illustrates relation between a temperature and an open circuit voltage.

In FIG. 9B, the horizontal axis indicates a temperature of the photoelectric conversion element 1, and the vertical axis indicates the open circuit voltage $V_{OC}$ between the first and second electrodes 2 and 3. The voltage $V_{OC}$ is acquired from the bias voltage $V_b$ when the current $I_{obs}$ becomes zero at each straight line of FIG. 8.

In FIG. 10, the horizontal axis indicates a temperature of the photoelectric conversion element 1, and the vertical axis indicates the resistance $R_{bulk}$ of the photoelectric conversion element 1. Here, assuming that "$R_{bulk}+R_{contact}$" is equal to $R_{bulk}$, and $I_{SC}$ is equal to $I_{shift}$, the resistance $R_{bulk}$ of FIG. 10 was acquired from FIG. 9A and FIG. 9B and the above-described equation (1).

As illustrated in FIG. 9A, FIG. 9B, and FIG. 10, the open circuit voltage $V_{OC}$ is very large even when the current $I_{SC}$ does not greatly change depending on a change in temperature. The open circuit voltage $V_{OC}$ is about 70 V at the maximum, and is much larger than a voltage equivalent to a bandgap width (about 2 eV) of the photoelectric conversion element 1. Thus, the photoelectric conversion device 10 according to the present embodiment is capable of generating electromotive force much larger than the voltage equivalent to the bandgap width of the photoelectric conversion element 1, differently from a conventional photoelectric conversion element using a p-n junction.

Further, as illustrated in FIG. 9A, FIG. 9B, and FIG. 10, even though the open circuit voltage $V_{OC}$ becomes very large, i.e., the resistance $R_{bulk}$ increases $10^4$ times or more, the current $I_{SC}$ does not greatly change. This indicates that current with less energy dissipation is generated in the photoelectric conversion element 1. Such current is referred to also as shift current in the present application.

Experimental Example 2

Figure 11:
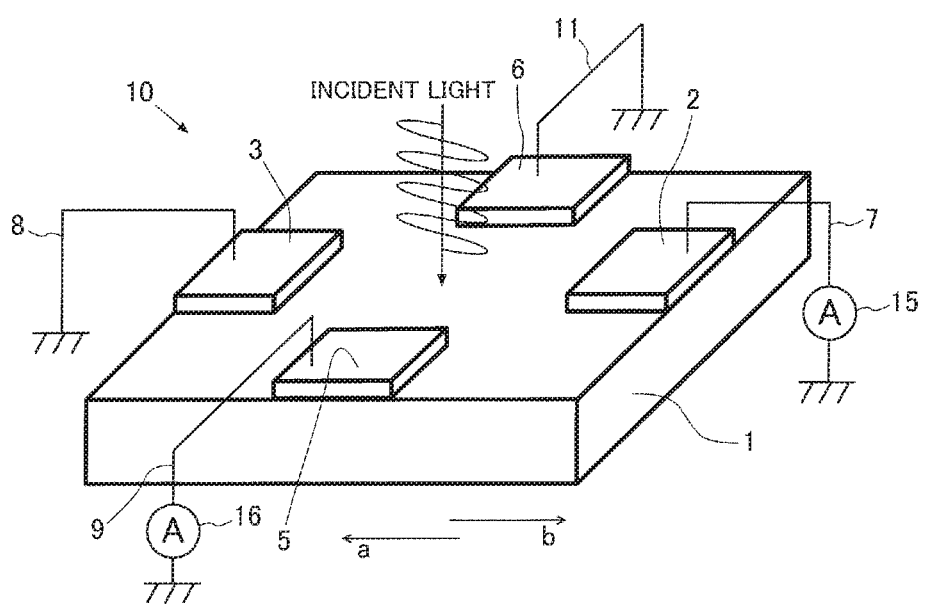
FIG. 11 illustrates a photoelectric conversion device in an experimental example 2.

An experimental example 2 of the photoelectric conversion device 10 according to the embodiment of the present invention is described. In the experimental example 2, the polar material that forms the photoelectric conversion element 1 was TTF-CA as a p-type semiconductor, and the material that forms each of the first and second electrodes 2 and 3 was Pt. The Curie temperature of TTF-CA is about 81 K. When a temperature of TTF-CA becomes equal to or lower than the Curie temperature, TTF-CA becomes ferroelectric. Such a photoelectric conversion device 10 was prepared as illustrated in FIG. 11. Further, in FIG. 11, third and fourth electrodes 5 and 6 for experiment were connected to the photoelectric conversion element 1. The direction in which the third and fourth electrodes 5 and 6 are separated from each other is orthogonal to the direction in which the first and second electrodes 2 and 3 are separated from each other. The first to fourth electrodes 2, 3, 5, and 6 were grounded by current lines (conducting wires) 7, 8, 9, and 11. The current lines 7 and 9 were provided with ammeters 15 and 16, respectively.

Similarly to the experimental example 1, a temperature of the photoelectric conversion element 1 was gradually lowered in a state where light was made incident on the photoelectric conversion element 1. Further, at each temperature of the photoelectric conversion element 1, values of currents flowing through the current lines 7 and 9 were measured by the ammeters 15 and 16 while changing a bias voltage $V_b$ applied between the first and second electrodes 2 and 3 and a bias voltage $V_{b2}$ applied between the third and fourth electrodes 5 and 6. Note that at each temperature, an electric field was applied to the photoelectric conversion element 1 in the direction a that is the separation direction of the first and second electrodes 2 and 3 to adjust the polarization direction, the application of the electric field was then stopped, and currents flowing through the current lines 7 and 9 were measured. After a temperature of the photoelectric conversion element 1 becomes equal to or lower than the Curie temperature, and current flowed through the current lines 7 and 9 at the bias voltage $V_b$ of zero, currents were measured by the ammeters 15 and 16 without the application of the electric field at each temperature as in the experimental example 1. The results of the measurement performed in this manner are illustrated in FIG. 12A and FIG. 12B.

Figure 12A:
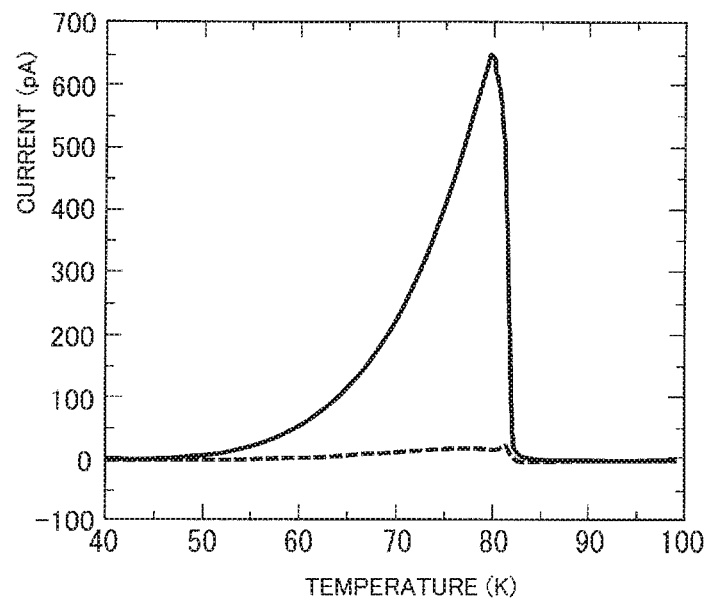
FIG. 12A is a measurement result of the experimental example 2, and illustrates relation between a temperature and a current.
Figure 12B:
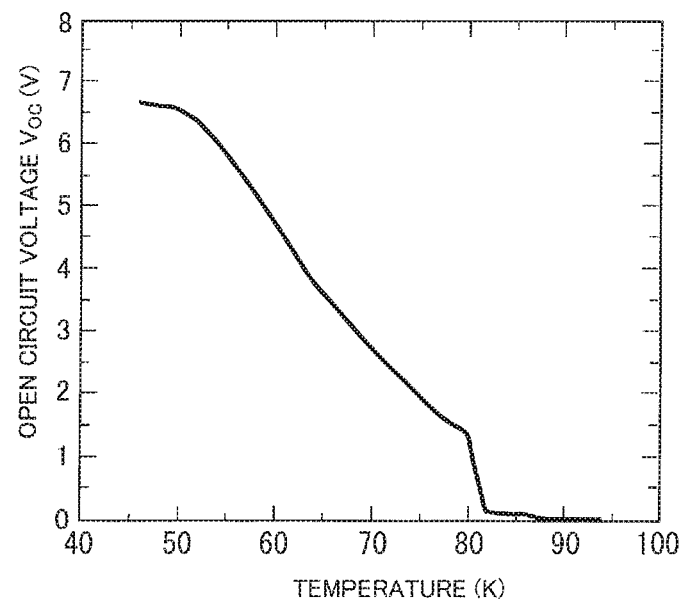
FIG. 12B is a measurement result of the experimental example 2, and illustrates relation between a temperature and an open circuit voltage.

In FIG. 12A, the horizontal axis indicates a temperature of the photoelectric conversion element 1, and the vertical axis indicates a value of the current measured by each of the ammeters 15 and 16. In FIG. 12A, the thick solid line indicates a value measured by the ammeter 15, and the thick broken line indicates a value measured by the ammeter 16. Note that FIG. 12A indicates values measured by the ammeters 15 and 16 in a state where the bias voltage $V_b$ between the first and second electrodes 2 and 3 and the bias voltage $V_{b2}$ between the third and fourth electrodes 5 and 6 are zero.

In the process of lowering a temperature of the photoelectric conversion element 1, when a temperature of the photoelectric conversion element 1 becomes equal to or lower than the Curie temperature, the current was abruptly generated as illustrated by the thick solid line of FIG. 12A. This indicates that the photoelectric conversion element 1 is transferred into ferroelectric at the Curie temperature, and the space-inversion symmetry of the structure thereof is broken by the application of the electric field.

Further, as understood from the measurement result of the thick solid line in FIG. 12A, the first and second electrodes 2 and 3 are separated in the polarization direction of the photoelectric conversion element 1 to thereby make it possible to take out, from the photoelectric conversion element 1, the current due to the light incidence on the photoelectric conversion element 1. Meanwhile, as understood from the measurement result of the thick broken line of FIG. 12A, the current can be hardly taken out from the third and fourth electrodes 5 and 6 arranged so as to be separated in the direction orthogonal to the polarization direction of the photoelectric conversion element 1.

In FIG. 12B, the horizontal axis indicates a temperature of the photoelectric conversion element 1, and the vertical axis indicates the open circuit voltage $V_{OC}$ between the first and second electrodes 2 and 3. Magnitude of $V_{OC}$ corresponds to magnitude of the bias voltage $V_b$ applied between the first and second electrodes 2 and 3 when a measured value of the ammeter 15 is zero. As understood from FIG. 12B, $V_{OC}$ is about 6.5 V at 50 K, and is much larger than a voltage equivalent to a bandgap width (about 0.5 eV) of the photoelectric conversion element 1.

Further, in the experimental example 2, when a temperature of the photoelectric conversion element 1 is 79 K in FIG. 11, a current was measured by the ammeter 15 while changing the bias voltage $V_b$ applied between the first and second electrodes 2 and 3 as described above, in each of the case where the electric field is applied to the photoelectric conversion element 1 in the direction a and the case where the electric field is applied to the photoelectric conversion element 1 in the direction b opposite to the direction a. The measurement results are illustrated in FIG. 13.

Figure 13:
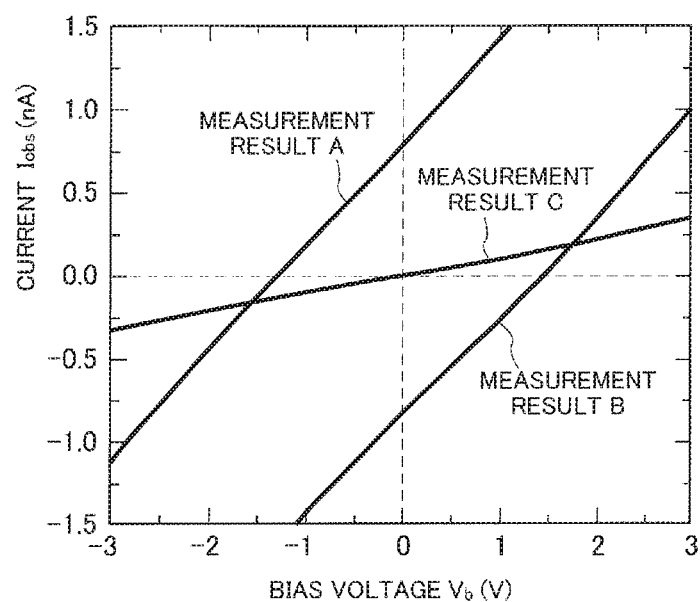
FIG. 13 is a measurement result of the experimental example 2, and illustrates relation between a bias voltage and a current.

In FIG. 13, the horizontal axis indicates the bias voltage $V_b$ applied between the first and second electrodes 2 and 3, and the vertical axis indicates each current value $I_{obs}$ measured by the ammeter 15. In FIG. 13, the measurement result A indicates a current value $I_{obs}$ when light is made incident on the photoelectric conversion element 1 where the electric field is applied to the photoelectric conversion element 1 in the direction a, the measurement result B indicates a current value $I_{obs}$ when light is made incident on the photoelectric conversion element 1 where the electric field is applied to the photoelectric conversion element 1 in the direction b, and the measurement result C indicates a current value $I_{obs}$ when light is not made incident on the photoelectric conversion element 1 where the electric field is applied to the photoelectric conversion element 1 in the direction a.

As understood from the measurement results A and B of FIG. 13, switching the application direction of the electric field between the direction a and the direction b switches the polarization direction of the photoelectric conversion element 1, thereby making it possible to change the direction in which the current is taken out from the first and second electrodes. Note that in the measurement result C of FIG. 13, the current due to the light incidence is not generated in the photoelectric conversion element 1, and the current $I_{obs}$ proportional to the bias voltage $V_b$ is generated.

Experimental Example 3

Figure 14:
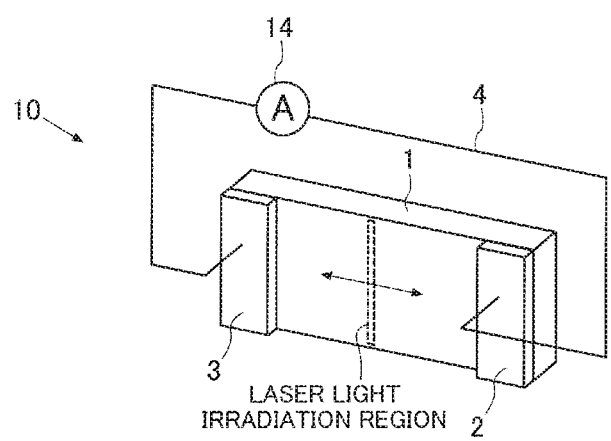
FIG. 14 illustrates a photoelectric conversion device in an experimental example 3.

An experimental example 3 of the photoelectric conversion device 10 according to an embodiment of the present invention is described. In this experimental example 3, the polar material that forms a photoelectric conversion element 1 was TTF-CA, and the material that forms each of the first and second electrodes 2 and 3 was Pt. A separation distance between the first and second electrodes 2 and 3 was set to be about 670 Further, as in FIG. 14, the first and second electrodes 2 and 3 were connected to each other by the current line 4 (conducting wire), and the current line 4 was provided with an ammeter 14.

In the experimental example 3, the experiment was performed in the following manner, in each of the case where a temperature of the photoelectric conversion element 1 was set as 70 K lower than the Curie temperature thereof and the case where a temperature of the photoelectric conversion element 1 was set as 90 K higher than the Curie temperature thereof. As in FIG. 14, the photoelectric conversion element 1 was irradiated with laser light at an intermediate position between the first and second electrodes 2 and 3. An irradiation region (region surrounded by the broken line in FIG. 14) of the laser light in the photoelectric conversion element 1 is a region that linearly extends in a direction orthogonal to the separation direction of the electrodes 2 and 3. The position of the irradiation region was changed in the electrode separation direction indicated by the arrow in FIG. 14, and a current was measured by the ammeter 14 for each position of the irradiation region. Note that when a temperature of the photoelectric conversion element 1 is 70 K, an electric field is applied to the photoelectric conversion element 1 in the electrode separation direction to thereby adjust the polarization of the photoelectric conversion element 1 to be the electrode separation direction, and then, the laser light was applied to the photoelectric conversion element 1.

Figure 15A:
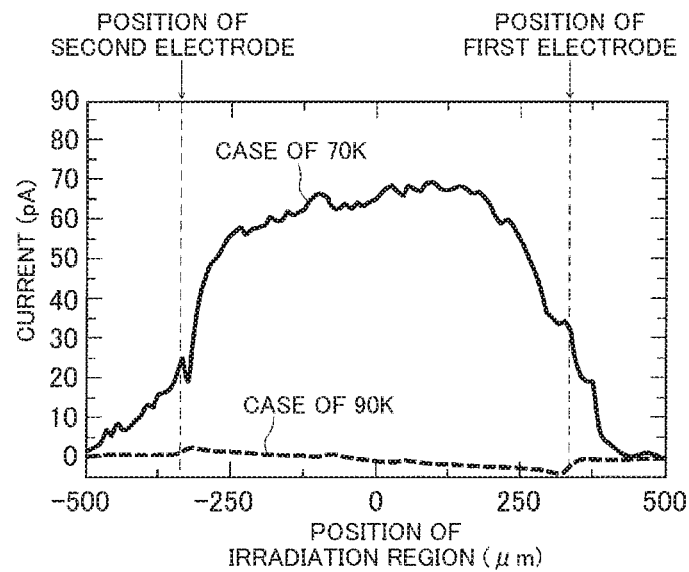
FIG. 15A is a measurement result of the experimental example 3, and illustrates relation between a position of a laser light irradiation region and a current in the case where a temperature of the photoelectric conversion element is 70 K and in the case where the temperature is 90 K.
Figure 15B:
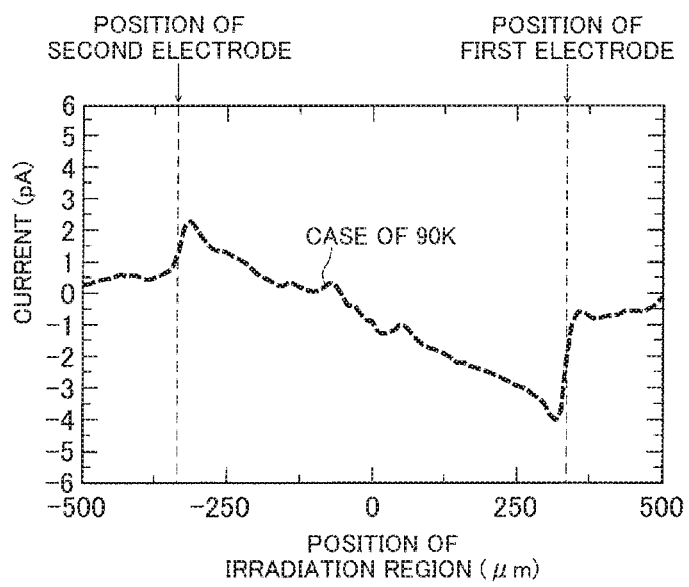
FIG. 15B is an enlarged diagram of FIG. 15A in the case where the temperature is 90 K.

The results of measurements performed in this manner are illustrated in FIG. 15A and FIG. 15B. In FIG. 15A, the horizontal axis indicates a position of the irradiation region, and the vertical axis indicates a current value measured by the ammeter 14. The origin of the horizontal axis is the center between the first and second electrodes 2 and 3. In FIG. 15A and FIG. 15B, the thick solid line is the measurement result in the case where a temperature of the photoelectric conversion element 1 was 70 K, and the thick broken line is the measurement result in the case where a temperature of the photoelectric conversion element 1 was 90 K. FIG. 15B illustrates the measurement result at 90 K in FIG. 15A enlarged in the vertical-axis direction.

In the case of 70 K, a measurement value of the current is large even when the laser light was applied to any position between the first and second electrodes 2 and 3. Particularly, in the case of 70 K, a measurement value of the current is large (about 70 pA) even when the laser light is applied to the center between the first and second electrodes 2 and 3. From this, it can be understood that majority carriers generated by the laser light are moved in the electrode separation direction over a distance of several hundreds of micrometers. Thus, it is understood that the current due to the carriers is current (shift current) with less energy dissipation.

Meanwhile, in the case of 90 K, as indicated by the thick broken lines in FIG. 15A and FIG. 15B, a current measurement value is very small as compared with the case of 70 K, and current is generated only when a irradiation region of the laser light is in the vicinity of the electrodes 2 and 3. A profile of such a current measurement value indicates that the generated current is typical diffusion current.

Experimental Example 4: Difference from Comparative Example

An experimental example 4 of a photoelectric conversion device 20 according to a comparative example is described. As in FIG. 16A, the photoelectric conversion device 20 is configured such that first and second electrodes 22 and 23 are separated from each other and are connected to a photoelectric conversion element 21. A polar material that forms the photoelectric conversion element 21 was SbSI as a p-type semiconductor, a material that forms the first electrode 22 was Pt, and a material that forms the second electrode 23 was LiF/Al. A Fermi level of Pt is lower than a Fermi level of SbSI, but a Fermi level of LiF/Al is higher than the Fermi level of SbSI. Accordingly, a band structure of the photoelectric conversion device 20 in FIG. 16A becomes that as illustrated in FIG. 4B described above.

Figure 16A:
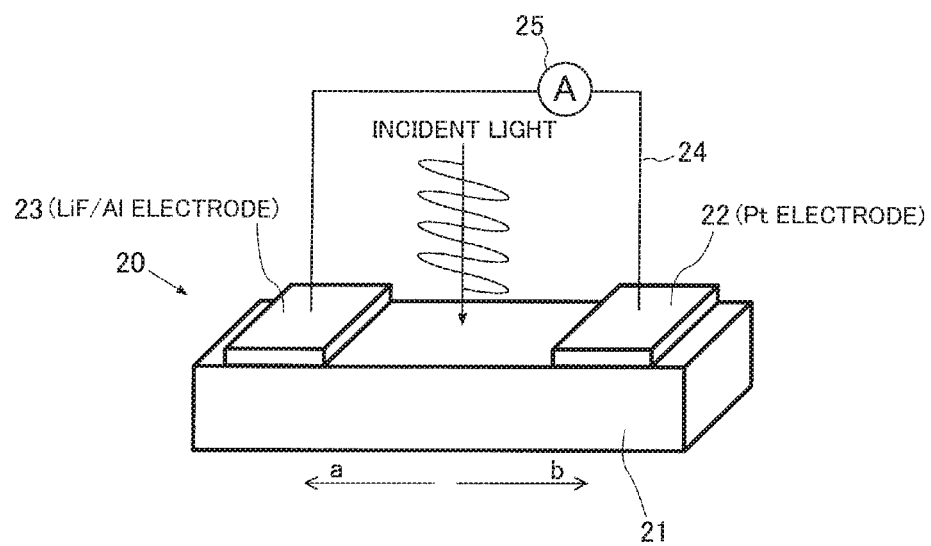
FIG. 16A illustrates a photoelectric conversion device according to a comparative example in an experimental example 4.

Further, as in FIG. 16A, the first and second electrodes 22 and 23 were connected to each other by a current line 24, and the current line 24 was provided with an ammeter 25. A temperature of the photoelectric conversion element 21 was gradually lowered in a state where light is made incident on the photoelectric conversion element 21. At each temperature of the photoelectric conversion element 21, a value of current flowing through the current line 24 was measured by the ammeter 25 without applying a bias voltage between the first and second electrodes 22 and 23. Note that at each temperature, an electric field was applied to the photoelectric conversion element 21 in the direction a of FIG. 16A to polarize the photoelectric conversion element 21 in the direction a, the application of the electric field was then stopped, a current flowing through the current line 24 was measured, an electric field was then applied to the photoelectric conversion element 21 in the direction b of FIG. 16A to polarize the photoelectric conversion element 21 in the direction b, the application of the electric field was then stopped, and a current flowing through the current line 24 was measured. The results of the measurement performed in this manner are illustrated in FIG. 16B.

Figure 16B:
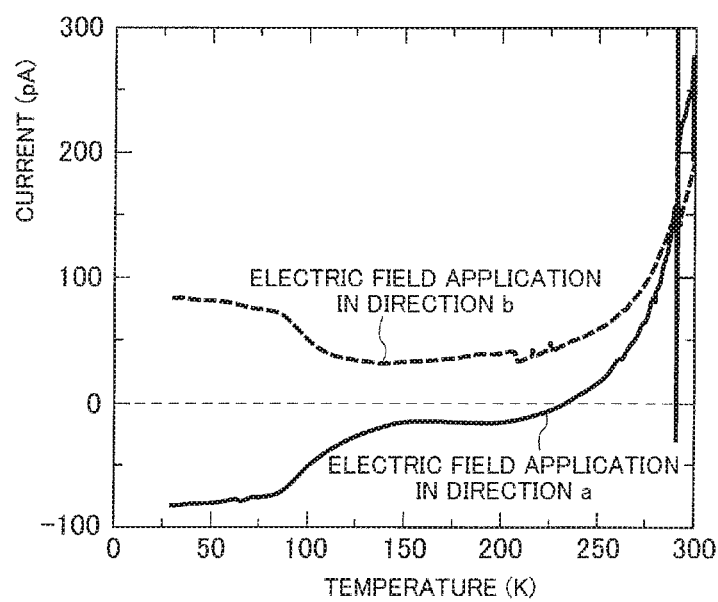
FIG. 16B is a measurement result of the experimental example 4, and illustrates relation between a temperature and a current.

In FIG. 16B, the horizontal axis indicates a temperature of the photoelectric conversion element 21, and the vertical axis indicates a current measured by the ammeter 25. In FIG. 16B, the thick solid line is the measurement result in the case where the electric field is applied in the direction a, and the thick broken line is the measurement result in the case where the electric field is applied in the direction b. As understood from FIG. 16B, when a temperature of the photoelectric conversion element 21 was close to the Curie temperature (about 295 K) and was equal to or lower than the Curie temperature, the current flowed in the same direction regardless of the direction of application of the electric field. This differs from the characteristics in the present embodiment that when the polarization direction is reversed as described above with reference to FIG. 13, the direction of the current taken out from the first and second electrodes 2 and 3 is also reversed.

<Experimental example 5>

Figure 17A:
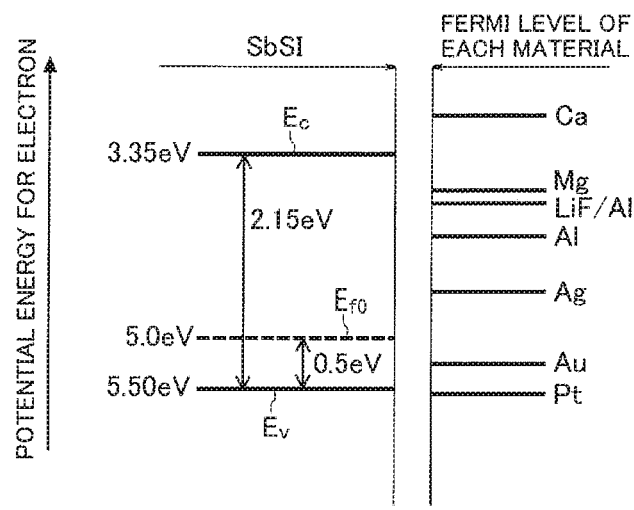
FIG. 17A is a diagram illustrating relation between a band structure of a polar material SbSI and a Fermi level of each material.

FIG. 17A is a diagram illustrating a band structure of a polar material SbSI in relation to a Fermi level of each material. In FIG. 17A, the band structure of SbSI is illustrated on the left side. In SbSI on the left side of FIG. 17A, $E_{f0}$ indicates a Fermi level, $E_c$ indicates an energy level at the lower end of a conduction band, and $E_v$ indicates an energy level at the upper end of a valance band. The levels $E_{f0}$, $E_c$, and $E_v$ are lower than a potential energy of an electron in a vacuum by 5.0 eV, 3.35 eV, and 5.50 eV, respectively. The Fermi levels of materials Pt, Au, Ag, Al, LiF/Al, Mg, and Ca are respectively indicated by thick horizontal lines on the right side of FIG. 17A.

An experiment was performed on a photoelectric conversion device in which two electrodes are provided at an interval on a photoelectric conversion element formed of the polar material SbSI. In this experiment, a metal material of both of the two electrodes was Pt, Au, Ag, Al, LiF/Al, Mg or Ca in FIG. 17A, and in each case of the metal materials, a current generated by light incidence on the photoelectric conversion element was taken out from the two electrodes and was measured, in a state where a temperature of the photoelectric conversion element was set as 200 K lower than the Curie temperature (about 295 K) of SbSI, and the photoelectric conversion element was polarized in the separation direction of the two electrodes. The measurement was performed using an ammeter provided at a conducting wire connecting the two electrodes to each other. At the time of this measurement, no bias voltage was applied to the two electrodes. The results of the measurement performed in this manner are illustrated in FIG. 17B.

Figure 17B:
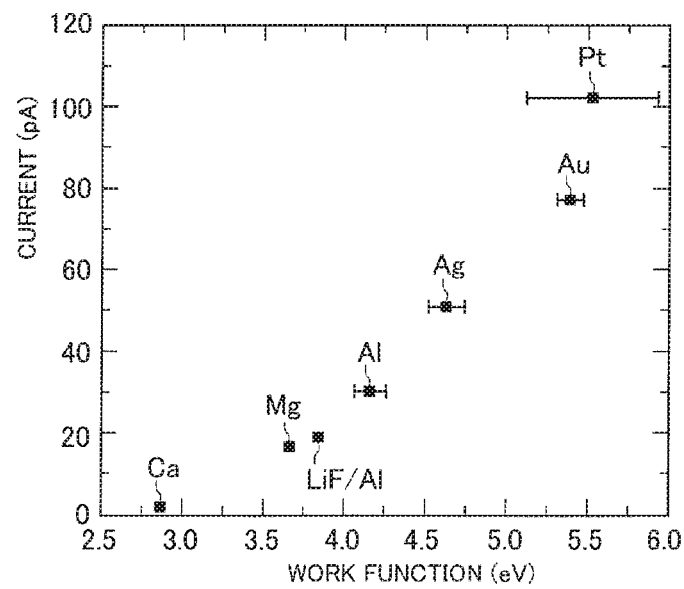
FIG. 17B illustrates a measurement result of an experimental example 5 in the cases of the respective materials forming the electrodes.

In FIG. 17B, the horizontal axis indicates a work function (equivalent to a Fermi level) of the material of the electrodes, and the vertical axis indicates a current value measured in the above-described manner. The black square marks in FIG. 17B each indicate the measurement result where the materials of both of the two electrodes are Pt, Au, Ag, Al, LiF/Al, Mg or Ca.

As understood from FIG. 17B, when Pt or Au having a Fermi level lower than the Fermi level $E_{f0}$ of SbSI as a p-type semiconductor was selected as the electrode material, the taken-out current is much larger than in the cases of the other electrode materials.

Experimental Example 6: Difference from Comparative Example

Figure 18:
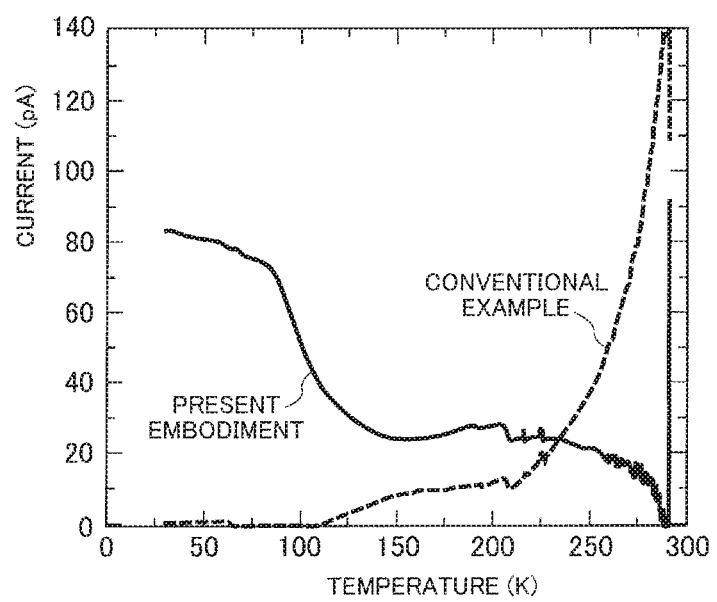
FIG. 18 is a measurement result of an experimental example 6, and illustrates relation between a temperature and a current.

An experiment for comparing the photoelectric conversion device 10 according to the embodiment of the present invention with a conventional example was performed. In this example, in the photoelectric conversion device 10 according to the embodiment of the present invention, the polar material that forms the photoelectric conversion element 1 was SbSI, and the material that forms each of the first and second electrodes 2 and 3 was Pt. A temperature of the photoelectric conversion element 1 was gradually lowered, and in the same manner as that described above, at each temperature, a current taken out from the first and second electrodes 2 and 3 was measured in a state where the photoelectric conversion element 1 was polarized in the fixed electrode separation direction, and light of a constant intensity was made incident on the photoelectric conversion element 1. The thick solid line in FIG. 18 is the measurement result of the present embodiment.

Meanwhile, a conventional photoelectric conversion device that includes a conventional photoelectric conversion element with a p-n junction and includes two electrodes respectively connected to a p-type semiconductor and an n-type semiconductor of the photoelectric conversion element was provided as the conventional example. In such a photoelectric conversion device, a temperature of the photoelectric conversion element was gradually lowered, and at each temperature, light of a constant intensity was made incident on the photoelectric conversion element, and a value of current taken out from the two electrodes was measured. The thick broken line in FIG. 18 is the measurement result of this conventional example.

Figure 19A:
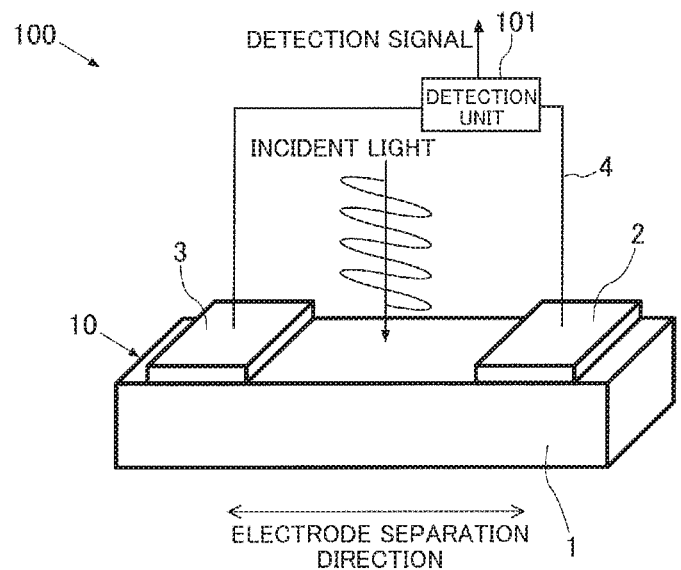
FIG. 19A is a schematic configuration diagram of a photosensor to which the photoelectric conversion device according to the present embodiment is applied.

In the case of the conventional photoelectric conversion device with the p-n junction, as understood from the conventional example of FIG. 18, a current becomes smaller as a temperature is lowered, and a current disappears at a temperature below about 100 K. In other words, a current generated in the photoelectric conversion device as the conventional example disappears at a low temperature. Meanwhile, in the case of the present embodiment with no p-n junction, a current becomes larger as the temperature is lowered. In other words, it is understood from FIG. 18 that the current generated in the photoelectric conversion device 10 according to the present embodiment is small-scattering current (shift current) that is maintained at a high value even at a low temperature Application Example FIG. 19A is a schematic configuration diagram of a photosensor 100 to which the photoelectric conversion device 10 according to the embodiment of the present invention is applied. The photosensor 100 detects light incidence on the photoelectric conversion element 1, on the basis of current taken out from the first and second electrodes 2 and 3. The photosensor 100 may include the above-described photoelectric conversion device 10, a current line 4, and a detection unit 101.

The current line 4 is connected to the first and second electrodes 2 and 3. The first and second electrodes 2 and 3 may be connected to each other through the current line 4. Current generated in the photoelectric conversion element 1 is taken out to the current line 4 through the first and second electrodes 2 and 3.

The detection unit 101 detects current flowing through the current line 4. When the current is detected, the detection unit 101 outputs a detection signal indicating that light is made incident on the photoelectric conversion element 1. For example, the detection unit 101 may be configured so as to output the detection signal when a value of the current flowing through the current line 4 exceeds a threshold value.

Figure 19B:
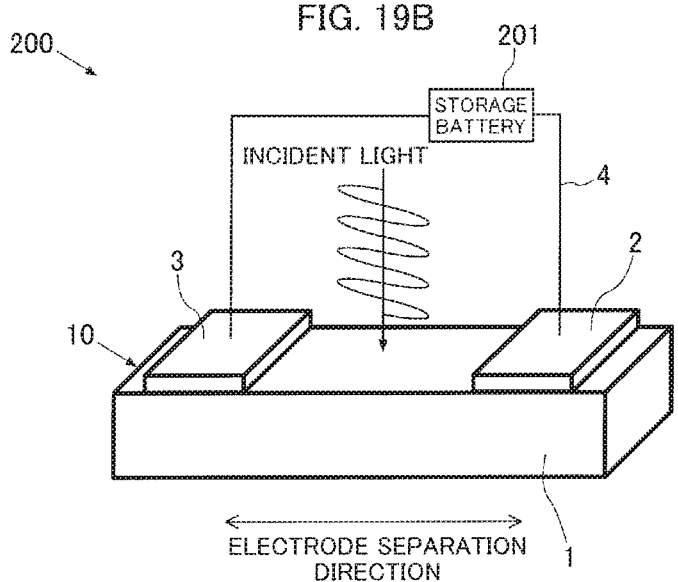
FIG. 19B is a schematic configuration diagram of a power generation device to which the photoelectric conversion device according to the present embodiment is applied.

FIG. 19B is a schematic configuration diagram of a power generation device 200 to which the photoelectric conversion device 10 according to the embodiment of the present invention is applied. The power generation device 200 supplies power taken out from the first and second electrodes 2 and 3 to a storage battery or a load (the storage battery 201 in FIG. 19B). The power generation device 200 may include the above-described photoelectric conversion device 10, a current line 4, and the storage battery 201 (or load). Note that the storage battery 201 (or load) does not need to be a constituent element of the power generation device 200.

The current line 4 is connected to the first and second electrodes 2 and 3. The first and second electrodes 2 and 3 may be connected to each other through the current line 4. Current generated in the photoelectric conversion element 1 by light incidence on the photoelectric conversion element 1 is taken out to the current line 4 through the first and second electrodes 2 and 3. Here, the light incident on the photoelectric conversion element 1 may be sunlight or radiant light generated from a heat source, for example.

The storage battery 201 receives, through the current line 4, power due to the current generated in the photoelectric conversion element 1, and stores the received power.

Note that when the load is provided instead of the storage battery 201, the power due to the current generated in the photoelectric conversion element 1 is supplied to the load through the current line 4. This load may be a device (e.g., an electric light, a drive device, or the like) that consumes the supplied power.

<Photoelectric Conversion Method>

A photoelectric conversion method according to an embodiment of the present invention includes steps S1 and S2. At the step S1, the above-described photoelectric conversion device 10 is prepared and installed in a desired position. At the step S2, in the photoelectric conversion device 10 prepared in the step S1, light is made incident on the photoelectric conversion element 1 at the position between the first and second electrodes 2 and 3, and current thereby generated in the photoelectric conversion element 1 is taken out from the first and second electrodes 2 and 3 to the current line 4. The taken-out current flows to a desired part (e.g., the above-described detection unit 101, the storage battery 201, or the load) through the current line 4.

Before the step S2 is performed, the photoelectric conversion element 1 is polarized in the electrode separation direction, and the polarization direction of the photoelectric conversion element 1 is thus adjusted. In this state, the step S2 is performed. For example, when the polar material forming the photoelectric conversion element 1 is a ferroelectric material, before the step S2 is performed, an electric field is applied to the photoelectric conversion element 1 in the electrode separation direction in a state where the photoelectric conversion element 1 has been brought into a ferroelectric state under an environment of a temperature equal to or lower than the Curie temperature of the polar material. Thereby, the polarization direction of the photoelectric conversion element 1 is adjusted to be the electrode separation direction. In this state, the step S2 is performed. However, when the step S2 is performed, the application of the electric field to the photoelectric conversion element 1 may be stopped.

Effects of Embodiment (1) According to the above-described embodiment of the present invention, a pair of an electron and a positive hole generated by light incidence on the photoelectric conversion element 1 are moved in the directions opposite to each other by the breakdown of the space-inversion symmetry of the structure of the polar material forming the photoelectric conversion element 1. Thus, the majority carriers (electrons or positive holes) of the photoelectric conversion element 1 are moved to one of the first and second electrodes 2 and 3.

(2) Meanwhile, there occurs no potential barrier that prevents the flow of the majority carriers from the other of the first and second electrodes 2 and 3 to the photoelectric conversion element 1. Thus, accompanying the movement of the majority carriers to one of the electrode 2 or 3 due to the breakdown of the space-inversion symmetry in the photoelectric conversion element 1, the majority carriers flow from the other of the electrode 2 or 3 to the photoelectric conversion element 1.

(3) The current due to each of the above (1) and (2) basically differs in the generation mechanism from current caused by a p-n junction. The current of which generation mechanism differs from the conventional one has a characteristic of small scattering (e.g., refer to FIG. 15A described above). In other words, carriers generated by light incidence on the conventional photoelectric conversion element including a p-n junction are moved while being influenced by scattering due to impurities, defects, lattice vibrations, and the like, whereas according to the present embodiment, the current that is not influenced by such scattering is generated. In addition to this matter, according to the present embodiment, there is no potential barrier to the majority carriers as described above, and thus, the current due to the majority carriers generated in the photoelectric conversion device 10 can be efficiently taken out to the outside.

(4) Since the photoelectric conversion element 1 has no p-n junction, it becomes unnecessary to take into account constraints related to a p-n junction such as formation of a suitable p-n junction surface.

(5) The current having no temperature dependency can be generated by light incidence on the photoelectric conversion element 1 (e.g., refer to FIG. 9A described above).

(6) It is possible to obtain electromotive force (open circuit voltage $V_{OC}$) far exceeding a voltage equivalent to a bandgap width of the photoelectric conversion element 1 (e.g., refer to FIG. 9B and FIG. 12B described above).

(7) When photoelectric conversion is performed using the photoelectric conversion element including a p-n junction as in the conventional method, shot noise caused by fluctuation in the number of electrons is generated. Meanwhile, in the above-described photoelectric conversion method according to the present embodiment, such shot noise is not generated because the current is caused on the basis of the property of a wave of an electron. Thus, low-noise photoelectric conversion can be implemented.

(8) The current is generated in a time scale (usually, about a femtosecond) of optical transition between the bands in the photoelectric conversion element 1, and for this reason, when pulse light is made incident on the photoelectric conversion element 1, photoelectric conversion with quick response to the pulse light and with less noise can be performed. Thus, for example, the photosensor 100 with quick response and with less noise can be implemented.

The present invention is not limited to the above-described embodiment. It is natural that various modifications can be made within the scope of the technical idea of the present invention. For example, the above-described effects do not necessarily limit the present invention. Further, the present invention may exhibit any one of the effects described in the present specification, or another effect that can be understood from the present specification.

DESCRIPTION OF REFERENCE SIGNS

1 Photoelectric conversion element
2 First electrode
3 Second electrode
4 Current line
5 Third electrode
6 Fourth electrode
7, 8, 9, 11 Current line
10 Photoelectric conversion device
13 Resistor
14, 15, 16 Ammeter
20 Photoelectric conversion device of comparative example
21 Photoelectric conversion element of comparative example
22 First electrode of comparative example
23 Second electrode of comparative example
24 Current line
25 Ammeter
100 Photosensor
101 Detection unit
200 Power generation device
201 Storage battery.

What is claimed is:

1. A photoelectric conversion device comprising:
   a photoelectric conversion element that is formed of a polar material and includes no p-n junction; and
   first and second electrodes that are provided on the photoelectric conversion element and are arranged at an interval,
   wherein the photoelectric conversion element is polarized between the first and second electrodes and has a structure of which space-inversion symmetry is broken,
   the first and second electrodes are each formed of a metal material that generates no substantial potential barrier, and the potential barrier prevents majority carriers for the photoelectric conversion element from moving from the electrode to the photoelectric conversion element, and
   the photoelectric conversion element and the first and second electrodes are structured such that light incidence on the photoelectric conversion element without voltage application between the first and second electrodes causes electromotive force to be generated between first and second electrodes, and enables electric current to be continuously taken out from the first and second electrodes.

2. The photoelectric conversion device according to claim 1, wherein when the photoelectric conversion element is a p-type semiconductor, the metal material has a Fermi level equal to or lower than a Fermi level of the polar material.

3. The photoelectric conversion device according to claim 1, wherein when the photoelectric conversion element is an n-type semiconductor, the metal material has a Fermi level equal to or higher than a Fermi level of the polar material.

4. The photoelectric conversion device according to claim 1, wherein the metal material of the first electrode is the same as the metal material of the second electrode.

5. The photoelectric conversion device according to claim 1, wherein the first and second electrodes are arranged at an interval in a polarization direction of the photoelectric conversion element.

6. The photoelectric conversion device according to claim 1, wherein the photoelectric conversion element is formed of a pyroelectric material or a ferroelectric material.

7. The photoelectric conversion device according to claim 6, wherein the pyroelectric material is $GaFeO_3$, CdS, GaN, ZnO, CdTe, BiTeI, or BiTeBr.

8. The photoelectric conversion device according to claim 6, wherein the ferroelectric material is SbSI, BiSI, TTF-CA (tetrathiafulvalene-p-chloranil), TTF-BA (tetrathiafulvalene-bromanil), $BiFeO_3$, TMB-TCNQ (tetramethylbenzidine-tetracyanoquinodimethane), $RMnO_3$ (R: rare-earth element), $Ca_3Mn_2O_7$, $LuFe_2O_4$, GeTe, $CH_3NH_3PbI_3$, (2-(ammoniomethyl)pyridinium)$SbI_5$, $Sn_2P_2S_6$, $BaTiO_3$, $PbTiO_3$, $Pb_5Ge_3O_{11}$, $Pb(Zr,Ti)O_3$(PZT), $LiNbO_3$, $LiTaO_3$, $KNbO_3$, or $KH_2PO_4$(KDP).

9. The photoelectric conversion device according to claim 1, wherein the photoelectric conversion element is formed by stacking thin layered films N times (where N is an integer of 1 or more),
   wherein the thin layered film is formed by stacking an A layer, a B layer, and a C layer in this order, and crystal materials of the A layer, the B layer, and the C layer are different from each other, and
   each of the A layer, the B layer, and the C layer is an atomic layer thin film having a nano-order thickness.

10. The photoelectric conversion device according to claim 9, wherein a combination of the crystal materials for the A layer, the B layer, and the C layer is a combination of $LaAlO_3$, $LaFeO_3$, and $LaCrO_3$, or a combination of $CaTiO_3$, $BaTiO_3$, and $SrTiO_3$.

11. A photosensor comprising a photoelectric conversion device according to claim 1,
    wherein the photosensor detects light incidence on the photoelectric conversion element, on a basis of the electric current taken out from the first and second electrodes.

12. A power generation device comprising a photoelectric conversion device according to claim 1,
    wherein the power generation device supplies, to a storage battery or a load, power taken out from the first and second electrode.

13. A photoelectric conversion method using a photoelectric conversion device that includes: a photoelectric conversion element that is formed of a polar material and includes no p-n junction; and first and second electrodes that are provided on the photoelectric conversion element and are arranged at an interval,
    wherein the photoelectric conversion element is polarized between the first and second electrodes and has a structure of which space-inversion symmetry is broken,
    the first and second electrodes are each formed of a metal material that generates no substantial potential barrier, and the potential barrier prevents majority carriers for the photoelectric conversion element from moving from the electrode to the photoelectric conversion element, the method comprises: in a state where a voltage is not applied between the first and second electrodes, making light incident on the photoelectric conversion element between the first and second electrodes, thereby causing electromotive force to be generated between first and second electrodes, and enabling electric current to be continuously taken out from the first and second electrodes.

14. The photoelectric conversion method according to claim 13, wherein the polar material is a ferroelectric material, and the method comprises:

applying an electric field to the photoelectric conversion element in a separation direction of the first and second electrodes, and thereby adjusting a polarization direction of the photoelectric conversion element to be the separation direction; and in a state where the polarization direction is adjusted in the separation direction, making light incident on the photoelectric conversion element between the first and second electrodes, and taking out, from the first and second electrodes, current generated in the photoelectric conversion element.

* * * * *